United States Patent
Ching et al.

(10) Patent No.: US 9,425,204 B2
(45) Date of Patent: Aug. 23, 2016

(54) NON-VOLATILE MEMORY FOR HIGH REWRITE CYCLES APPLICATION

(71) Applicant: eMemory Technology Inc., Hsin-Chu (TW)

(72) Inventors: Wen-Hao Ching, Hsinchu County (TW); Yen-Hsin Lai, Taipei (TW); Shih-Chen Wang, Taipei (TW)

(73) Assignee: eMemory Technology Inc., Hsin-Chu (TW)

( * ) Notice: Subject to any disclaimer, the term of this patent is extended or adjusted under 35 U.S.C. 154(b) by 30 days.

(21) Appl. No.: 14/271,429

(22) Filed: May 6, 2014

(65) Prior Publication Data
US 2015/0092498 A1 Apr. 2, 2015

Related U.S. Application Data

(60) Provisional application No. 61/883,205, filed on Sep. 27, 2013.

(51) Int. Cl.

| | | |
|---|---|---|
| *H01L 27/115* | (2006.01) | |
| *G11C 16/04* | (2006.01) | |
| *H01L 29/788* | (2006.01) | |
| *H01L 29/51* | (2006.01) | |
| *H01L 29/66* | (2006.01) | |
| *H01L 29/792* | (2006.01) | |
| *H01L 29/06* | (2006.01) | |
| *H01L 29/423* | (2006.01) | |
| *G11C 16/10* | (2006.01) | |
| *G11C 16/24* | (2006.01) | |
| *G11C 16/34* | (2006.01) | |
| *G11C 16/14* | (2006.01) | |
| *G11C 16/26* | (2006.01) | |
| *H01L 29/45* | (2006.01) | |

(52) U.S. Cl.
CPC ..... *H01L 27/11524* (2013.01); *G11C 16/0416* (2013.01); *G11C 16/0441* (2013.01); *G11C 16/10* (2013.01); *G11C 16/14* (2013.01); *G11C 16/24* (2013.01); *G11C 16/26* (2013.01); *G11C 16/3418* (2013.01); *H01L 27/1157* (2013.01); *H01L 27/11558* (2013.01); *H01L 29/0649* (2013.01); *H01L 29/42328* (2013.01); *H01L 29/42344* (2013.01); *H01L 29/45* (2013.01); *H01L 29/512* (2013.01); *H01L 29/66545* (2013.01); *H01L 29/66833* (2013.01); *H01L 29/788* (2013.01); *H01L 29/7881* (2013.01); *H01L 29/792* (2013.01); *G11C 2216/10* (2013.01)

(58) Field of Classification Search
CPC ..... H01L 27/11558; H01L 27/1156; H01L 27/11517; H01L 27/11519; G11C 16/0441; G11C 16/045; G11C 2216/10
See application file for complete search history.

(56) References Cited

U.S. PATENT DOCUMENTS

| | | | | |
|---|---|---|---|---|
| 5,587,945 A | * | 12/1996 | Lin | G11C 16/0441 257/E27.103 |
| 5,904,524 A | * | 5/1999 | Smolen | H01L 27/115 257/E21.422 |

(Continued)

FOREIGN PATENT DOCUMENTS

| | | |
|---|---|---|
| JP | 2007172820 A | 7/2007 |
| JP | 2013102119 A | 5/2013 |

*Primary Examiner* — Allison P Bernstein
(74) *Attorney, Agent, or Firm* — Winston Hsu; Scott Margo

(57) ABSTRACT

A non-volatile memory has an array of non-volatile memory cells. Each of the non-volatile memory cells includes a coupling device formed on a first well, a read device, a floating gate device formed on a second well and coupled to the coupling device, a program device formed on the second well, and an erase device formed on a third well and coupled to the first floating gate device. The read device, the program device, and the erase device are formed on separate wells so as to separate the cycling counts of a read operation, a program operation and an erase operation of the non-volatile memory cell.

13 Claims, 15 Drawing Sheets

(56) References Cited

U.S. PATENT DOCUMENTS

| | | | |
|---|---|---|---|
| 6,466,482 B2 * | 10/2002 | Shukuri | G11C 16/0441 365/185.01 |
| 6,815,757 B2 * | 11/2004 | Adams | H01L 27/115 257/315 |
| 7,968,926 B2 * | 6/2011 | Huang | G11C 16/0441 257/300 |
| 2007/0148851 A1 | 6/2007 | Kim | |
| 2008/0310237 A1 | 12/2008 | Zhou | |
| 2009/0159946 A1 | 6/2009 | Huang | |
| 2009/0290417 A1 | 11/2009 | Park | |
| 2012/0236646 A1 | 9/2012 | Hsu | |

* cited by examiner

NON-VOLATILE MEMORY FOR HIGH REWRITE CYCLES APPLICATION

CROSS REFERENCE TO RELATED APPLICATIONS

This non-provisional application claims priority of US provisional application U.S. 61/883,205 filed on Sep. 27, 2013.

BACKGROUND OF THE INVENTION

1. Field of the Invention

The present invention relates to a non-volatile memory and more particularly, a structure of a non-volatile memory cell and a structure of a non-volatile memory formed by a plurality of non-volatile memory cells in an array.

2. Description of the Prior Art

Non-volatile memories are commonly fabricated using a complementary metal oxide semiconductor (CMOS) process. Each of the non-volatile memory cells in a non-volatile memory is made such that it may perform a read operation, a program operation and an erase operation. A common problem with existing non-volatile memory cell structures is its endurance to multiple time programming/read/erase operation. The read device of the non-volatile memory cell is commonly placed in a diffusion region, and also functioned as an erase device or a program device. The electrical characteristics while reading a cell would therefore, besides the intentional threshold shifts, degrade due to the cumulated program or erase operations occurred in the shared active region. The number of cycles the non-volatile memory cell can endure without encountering an error is, therefore, not maximized.

SUMMARY OF THE INVENTION

An embodiment of the present invention discloses a non-volatile memory cell. The non-volatile memory cell comprises a coupling device formed on a first well, a read device electrically connected to the coupling device, a floating gate device formed on a second well, a program device electrically connected to the floating gate device and formed on the second well, and an erase device formed on a third well. The coupling device, the floating gate device and the erase device are coupled by a common floating gate.

Another embodiment of the present invention discloses a non-volatile memory. The non-volatile memory comprises a plurality of non-volatile memory cells, a plurality of first bit lines each coupled to first terminals of read devices of non-volatile memory cells in a corresponding column, a plurality of second bit lines each coupled to first terminals of program devices of non-volatile memory cells in a corresponding column, a plurality of first word lines each coupled to gates of read devices of non-volatile memory cells in a corresponding row, a plurality of second word lines each coupled to gates of program devices of non-volatile memory cells in a corresponding row, a plurality of source lines each coupled to second terminals of coupling devices of non-volatile memory cells in a corresponding row, and a plurality of erase lines each coupled to first terminals and second terminals of erase devices of non-volatile memory cells in a corresponding row.

An additional embodiment of the present invention discloses a method of operating a non-volatile memory. The non-volatile memory comprises a read device coupled to a first bit line and a first word line, a coupling device coupled to the read device and a source line, a program module coupled to a second bit line and a second word line, and an erase device coupled to the coupling device, the program module, and an erase line. The method comprises activating the read device and the coupling device and deactivating the program module during a read operation, activating the program module and deactivating the read device during a program operation, activating the erase device and deactivating the read device during an erase operation. The read device and the program device operate independently of each other.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
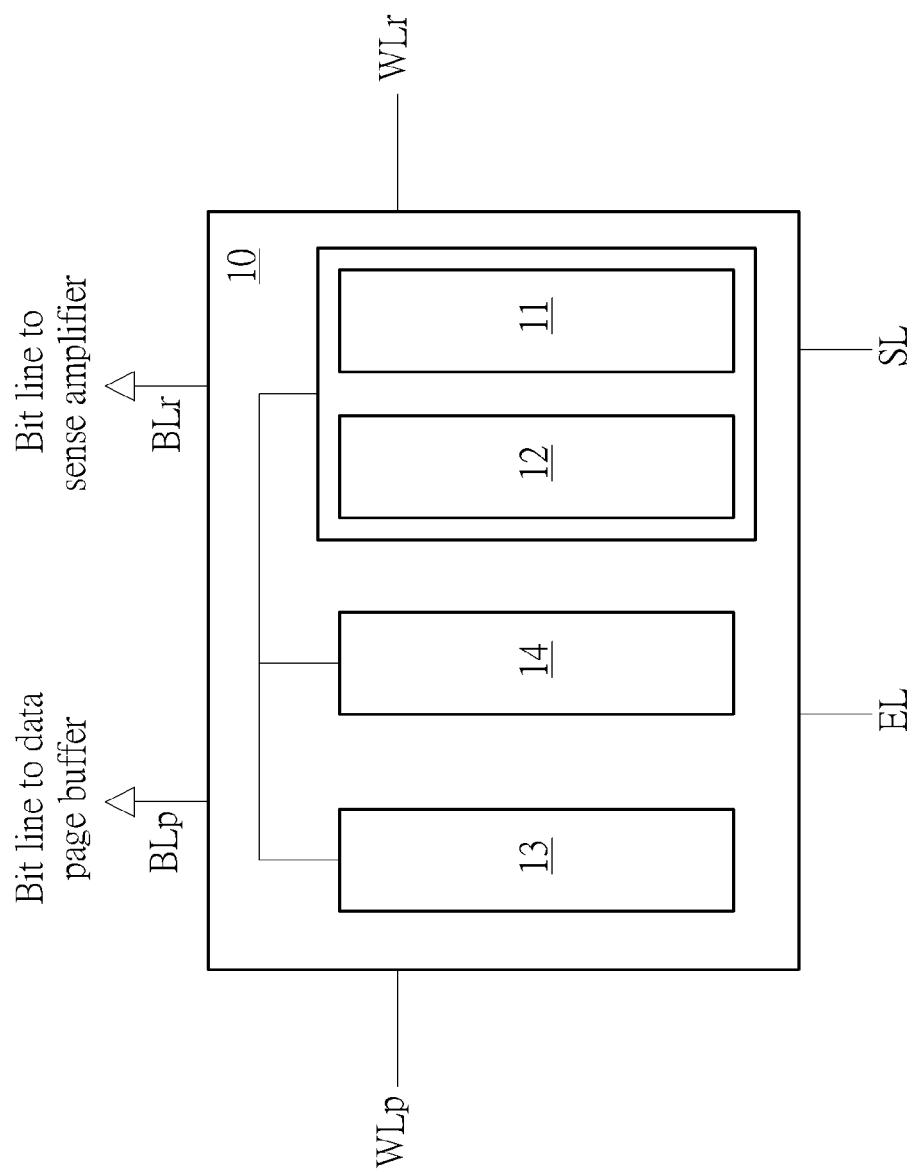
FIG. 1 illustrates a block diagram of a non-volatile memory cell according to an embodiment of the present invention.

Please refer to FIG. 1. FIG. 1 illustrates a block diagram of a non-volatile memory cell 10 according to an embodiment of the present invention. The non-volatile memory cell 10 comprises a read device 12, a coupling device 11, a program module 13, and an erase device 14. The read device 12 may be coupled to a first bit line (BLr) and a first word line (WLr). The coupling device 11 may be coupled to the read device 12 and a source line (SL). The program module 13 may be coupled to a second bit line (BLp) and a second word line (WLp). The erase device 14 may be coupled to the coupling device 11, the program module 13, and an erase line (EL). The program module 13 may comprise a floating gate device coupled to the coupling device 11 and the erase device 14, and a program device coupled to the floating gate device. The read device 12 and the program device operate independently of each other. The non-volatile memory cell 10 may be coupled to a data input or output buffer or a sense amplifier through the said bit lines (BLr, BLp). The non-volatile memory cell 10 is coupled to a word line for read through the first word line (WLr) and a word line for program through the second word line (WLp).

The non-volatile memory cell 10 comprises but is not limited to the following operations:

Read operation: Activate the read device 12 and the coupling device 11 and deactivate the program module 13;

Program operation: Activate the program module 13 and deactivate the read device 12;

Erase operation: Activate the erase device 14 and deactivate the read device 12;

Program inhibit operation: Deactivate the program module 13.

Note that operations may be performed individually. The sequence of the operations is not fixed. The erase operation may be performed before the program operation or the program inhibit operation. The read operation may be performed after the erase operation, the program operation or the program inhibit operation Also, operations may be repeated according to the input voltages received by the non-volatile memory cell 10.

Figure 2:
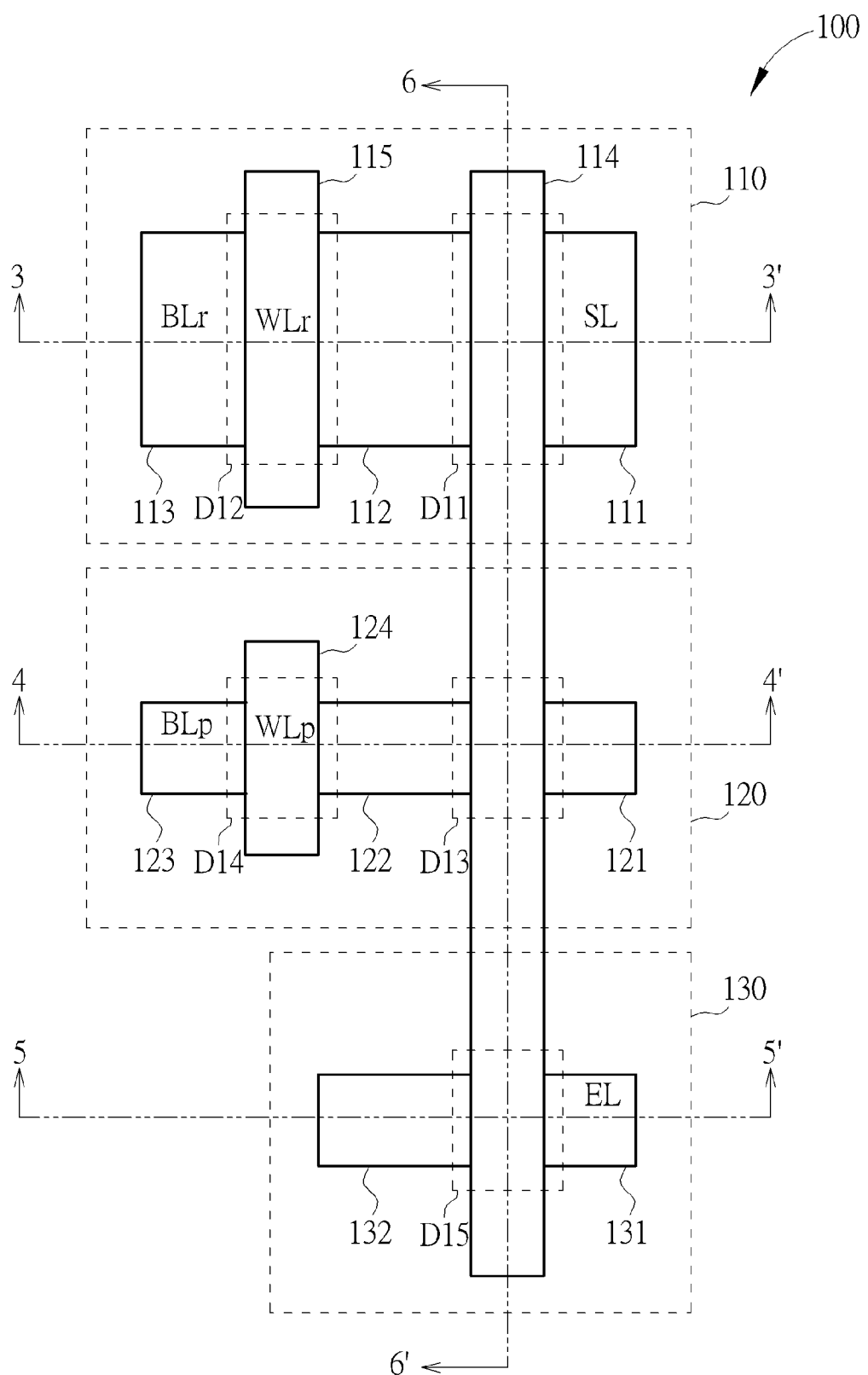
FIG. 2 illustrates a structure of a non-volatile memory cell according to a first embodiment of the present invention.

Please refer to FIG. 2. FIG. 2 illustrates a structure of a non-volatile memory cell 100 according to a first embodiment of the present invention. The non-volatile memory cell 100 may be formed on a substrate. The substrate may be p-type or n-type. The non-volatile memory cell 100 may comprise a coupling device D11, a read device D12, a floating gate device D13, a program device D14 and an erase device D15. The coupling device D11 and the read device D12 are formed on a first well 110. The floating gate device D13 and the program device D14 are formed on a second well 120. The erase device D15 is formed on a third well 130. The first well 110 and the third well 130 may be an n-well (NW). The second well 120 may be a p-well (PW). A first diffusion region 111, a second diffusion region 112 and a third diffusion region 113 are formed on the first well 110. A fourth diffusion region 121, a fifth diffusion region 122 and a sixth diffusion region 123 are formed on the second well 102. A seventh diffusion region 131 and an eighth diffusion region 132 are formed on the third well 130.

The coupling device D11 is formed by the first diffusion region 111, the second diffusion region 112 and a first part of a floating gate 114. The read device D12 is formed by the second diffusion region 112, the third diffusion region 113 and a gate 115. The floating gate device D13 is formed by the fourth diffusion region 121, the fifth diffusion region 122 and a second part of the floating gate 114. The program device D14 is formed by the fifth diffusion region 122, the sixth diffusion region 123 and a gate 124. The erase device D15 is formed by the seventh diffusion region 131, the eighth diffusion region 132 and a third part of the floating gate 114.

A source line (SL) is electrically coupled to the coupling device D11. A first bit line (BLr) is electrically coupled to the read device D12. A first word line (WLr) is electrically coupled to the gate 115 of the read device D12. A second bit line (BLp) is electrically coupled to the program device D14. A second word line (WLp) is electrically coupled to the gate 124 of the program device D14. And an erase line (EL) is electrically coupled to the erase device D15.

Figure 3:
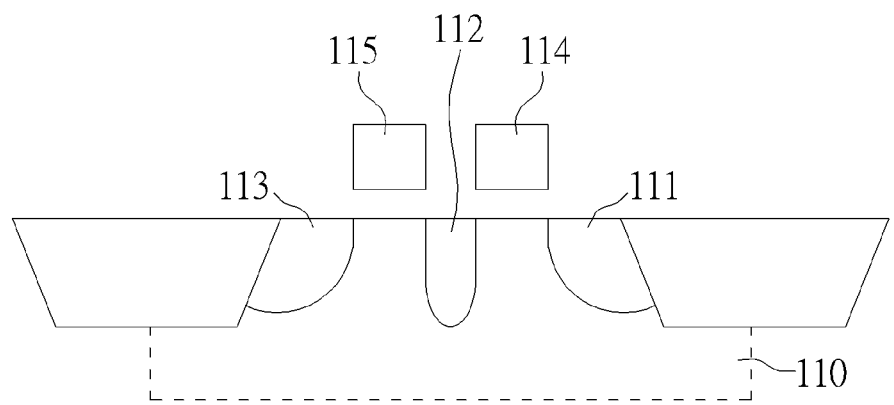
FIG. 3 illustrates a cross sectional view of the non-volatile memory cell in FIG. 2 along line 3-3'.

Please refer to FIG. 3 to FIG. 6. FIG. 3 to FIG. 6 illustrate cross sectional views of the non-volatile memory cell 100 in FIG. 2. FIG. 3 illustrates the cross sectional view of the non-volatile memory cell 100 in FIG. 2 along line 3-3'. The line 3-3' goes across the coupling device D11 and the read device D12 and the cross section of the coupling device D11 and the read device D12 formed on the first well 110 is illustrated.

Figure 4A:
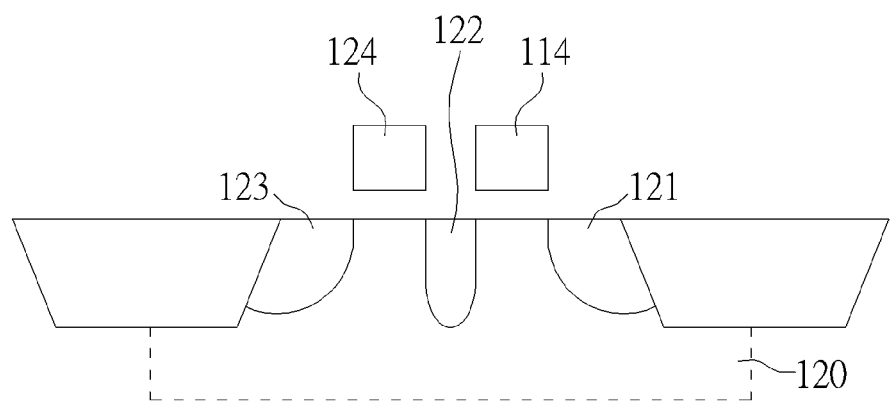
FIG. 4A illustrates a cross sectional view of the non-volatile memory cell in FIG. 2 along line 4-4' according to an embodiment of the present invention.
Figure 4B:
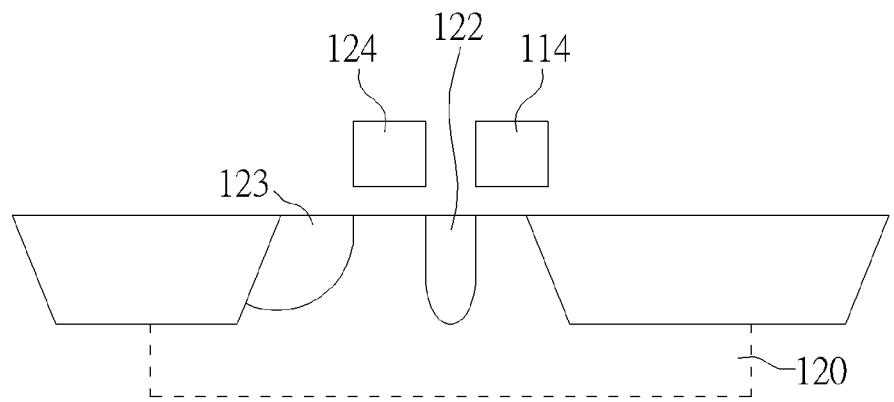
FIG. 4B illustrates a cross sectional view of the non-volatile memory cell in FIG. 2 along line 4-4' according to another embodiment of the present invention.

FIG. 4A illustrates the cross sectional view of the non-volatile memory cell 100 in FIG. 2 along line 4-4'. FIG. 4B illustrates the cross sectional view of the non-volatile memory cell 100 in FIG. 2 along line 4-4' according to another embodiment of the present invention. The line 4-4' goes across the program device D14 and the floating gate device D13 and the cross section of the program device D14 and the floating gate device D13 formed on the second well 120 is illustrated. In another embodiment, the fourth diffusion region 121 of the floating gate device D13 may be omitted such that the floating gate device D13 may serve as a capacitor device.

Figure 5A:
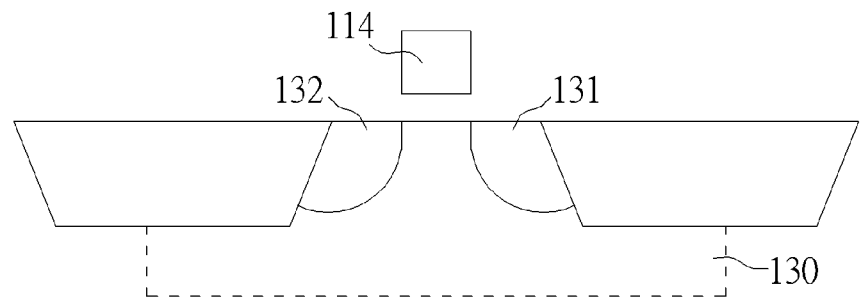
FIG. 5A illustrates a cross sectional view of the non-volatile memory cell in FIG. 2 along line 5-5' according to an embodiment of the present invention.
Figure 5B:
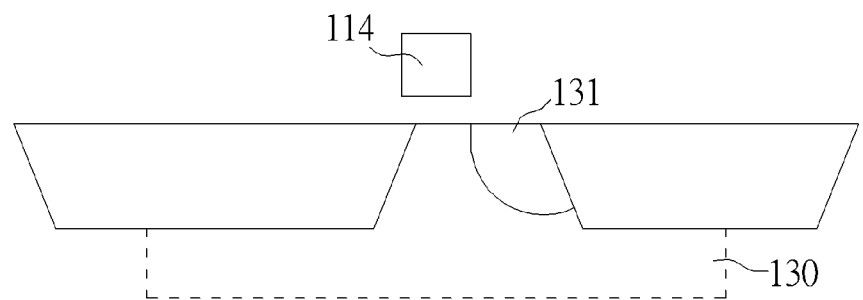
FIG. 5B illustrates a cross sectional view of the non-volatile memory cell in FIG. 2 along line 5-5' according to another embodiment of the present invention.

FIG. 5A illustrates the cross sectional view of the non-volatile memory cell 100 in FIG. 2 along line 5-5'. FIG. 5B illustrates the cross sectional view of the non-volatile memory cell 100 in FIG. 2 along line 5-5' according to another embodiment of the present invention. The line 5-5' goes across the erase device D15 and the cross section of the erase device D15 formed on the third well 130 is illustrated. In another embodiment, the eighth diffusion region 132 of the erase device D15 may be omitted such that the erase device D15 is served as a capacitor device.

In summary, FIGS. 4A and 5A respectively show the floating gate device D13 and the erase device D15 each being fabricated as a MOSFET device and FIGS. 4B and 5B respectively show the floating gate device D13 and the erase device D15 each being fabricated as a capacitor.

Figure 6:
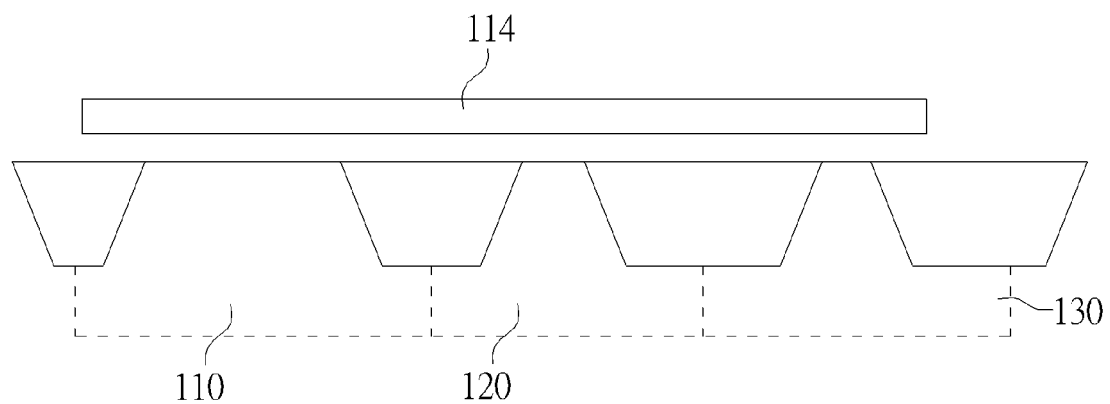
FIG. 6 illustrates a cross sectional view of the non-volatile memory cell in FIG. 2 along line 6-6'.

FIG. 6 illustrates the cross sectional view of the non-volatile memory cell 100 in FIG. 2 along line 6-6'. The line 6-6' goes across the floating gate 114 and the cross section of the floating gate 114 across the first well 110, the second well 120 and the third well 130 is illustrated.

Figure 7:
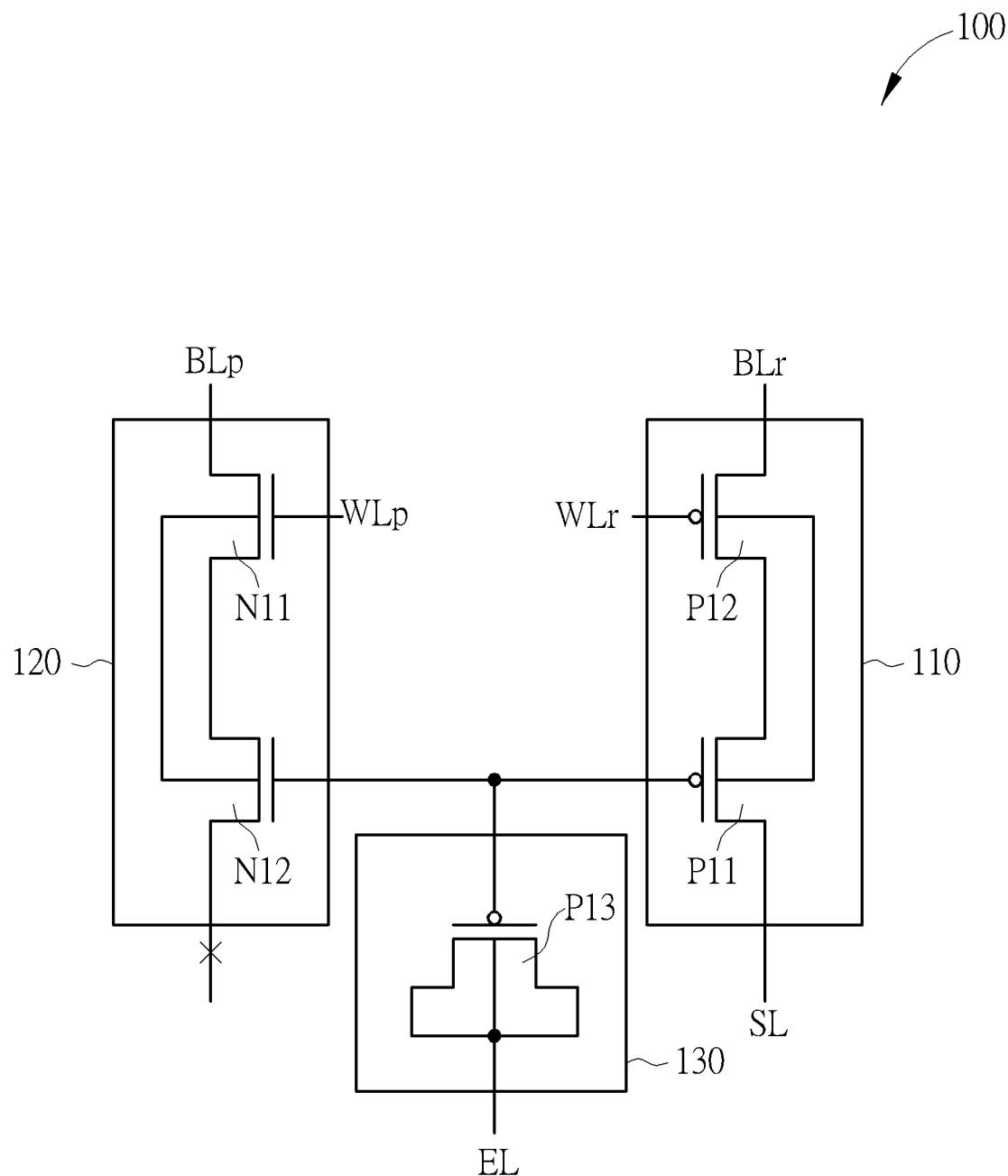
FIG. 7 illustrates a circuit diagram of the non-volatile memory cell in FIG. 2.

Please refer to FIG. 7. FIG. 7 illustrates a circuit diagram of the non-volatile memory cell 100 in FIG. 2. The non-volatile memory cell 100 may comprise the coupling device D11, the read device D12, the program device D14, the floating gate device D13 and the erase device D15. The coupling device D11 may be a first PMOS device P11 having a first terminal, a second terminal, a bulk terminal, and a gate terminal. In another embodiment of the present invention, the bulk terminal of the coupling device D11 may be coupled to the second terminal of the first PMOS device P11. The read device D12 may be a second PMOS device P12 having a first terminal, a second terminal coupled to the first terminal of the first PMOS device P11, a gate terminal and a bulk terminal coupled to the bulk terminal of the first PMOS device P11. The program device D14 may be a first NMOS device N11 having a first terminal, a second terminal, a gate terminal and a bulk terminal. The floating gate device D13 may be a second NMOS device N12 (NMOS transistor or NMOS capacitor) having a first terminal coupled to the second terminal of the first NMOS device N11, a gate terminal and a bulk terminal coupled to the bulk terminal of the first NMOS device N11. In another embodiment, the second NMOS device N12 may further comprise a second terminal. The erase device D15 may be a third PMOS device P13 (PMOS transistor or PMOS capacitor) having a first terminal, a bulk terminal coupled to the first terminal of the third PMOS device P13, and a gate terminal coupled to the gate terminal of the second NMOS device N12 and the gate terminal of the first PMOS device P11. In another embodiment, the third PMOS device P13 may further comprise a second terminal.

The source line (SL) is coupled to the second terminal of the first PMOS device P11. The first bit line (BLr) is coupled to the first terminal of the second PMOS device P12. The first word line (WLr) is coupled to the gate terminal of the second PMOS device P12. The second bit line (BLp) is coupled to the first terminal of the first NMOS device N11. The second word line (WLp) is coupled to the gate terminal of the first NMOS device N11. And the erase line (EL) is coupled to the first terminal of the third PMOS device P13. The second terminal of the second NMOS device N12 is floating. The bulk terminal of the first PMOS device P11 and the bulk terminal of the second PMOS device P12 are coupled to the first well 110. The bulk terminal of the second NMOS device N12 and the bulk terminal of the first NMOS device N11 are coupled to the second well 120.

For the non-volatile memory cell 100, a source line voltage is applied to the source line (SL). A first well voltage is applied to the first well 110. A first bit line voltage is applied to the first bit line (BLr). A first word line voltage is applied to the first word line (WLr). A second bit line voltage is applied to the second bit line (BLp). A second word line voltage is applied to the second word line (WLp). An erase line voltage is applied to the erase line (EL). A second well voltage is applied to the second well 120.

During a program operation of the non-volatile memory cell 100, an electric field may be built between the floating gate 114 and the first terminal of the floating gate device D13, in order to perform Fowler-Nordheim tunneling across the gate dielectric layer of the floating gate device D13. For example, the source line voltage, the first well voltage and the erase line voltage may range from 0V to 25V. The second bit line voltage and the second well voltage may be 0V. The second word line voltage may range from 0V to 8V to turn on the program device. The first bit line voltage may be floating or range from 0V to 25V. The first word line voltage may be floating or range from 0V to 25V. In another embodiment, to enable the programming operation, the bias conditions of the source line voltage and the first bit line voltage may be interchanged or be set at the same level. In an additional embodiment, to enable the programming operation, one of the bit line or the source line (SL) may be electrically connected to the first well 110.

For example of the program operation, the second bit line voltage may be at 0V and the second word line voltage may be at 3.3V. The source line voltage, the first well voltage, and the erase line voltage may be at 10V. The program device D14 may be activated because of the voltage difference between the second word line WLp and the second bit line BLp. Since the voltage coupled to the floating gate 114 is high enough, Fowler-Nordheim (FN) tunneling may be performed. Thus, electrons may be injected into the second part of the floating gate 114. During the program operation, the read device D12 may be inactive because the first bit line BLr may be floating and the read path is inactive.

During a program inhibit operation of the non-volatile memory cell 100, an electric field may be prevented from being built between the floating gate 114 and the first terminal of the floating gate device D13, to inhibit Fowler-Nordheim tunneling across the gate dielectric layer of the floating gate device D13. For example, the source line voltage, the erase line voltage, and the first well voltage may range from 0V to 25V. The second bit line voltage and the second word line voltage may range from 0V to 8V. The second well voltage may be 0V. The first bit line voltage may be floating or range from 0V to 25V. The first word line voltage may be floating or range from 0V to 25V. In another embodiment, to enable the program inhibit operation, the bias conditions of the source line voltage and the first bit line voltage may be interchanged or be set at the same level. In an additional embodiment, to enable the programming inhibit operation, one of the bit line or the source line (SL) may be electrically connected to the first well 110.

For example of the program inhibit operation, the second bit line voltage and the second word line voltage may be at 3.3V. The source line voltage, the first well voltage, and the erase line voltage may be at 10V. The program device D14 may be deactivated because of the zero voltage difference between the second word line WLp and the second bit line BLp. The channel formation on the floating gate device D13 is prevented from keeping a constant bias level. Therefore built up electric field for Fowler-Nordheim tunneling across the gate dielectric layer of the floating gate device D13 is avoided to ensure a successful program inhibit operation.

During an erase operation of the non-volatile memory cell 100, an electric field may be built between the floating gate 114 and the first terminal of the erase device D15, in order to perform Fowler-Nordheim tunneling across the gate dielectric layer of the erase device D15. For example, the source line voltage, the first well voltage and the second well voltage may be 0V. The erase line voltage may range from 0V to 25V. The first bit line voltage, the first word line voltage, the second bit line voltage, and the second word line voltage may be floating or 0V. In another embodiment, to enable the same erase operation, the bias conditions of the source line voltage and the first bit-line voltage may be interchanged.

For example of the erase operation, the erase line voltage may be at 10V. The source line voltage, the first well voltage, and the second well voltage may be at 0V. The erase device D15 may have a high voltage across the third part of the floating gate 114 to perform Fowler-Nordheim (FN) tunneling. The electrons may be ejected from the third part of the floating gate 114 and into the third well 130.

During a read operation of the non-volatile memory cell 100, a current sensing path may be built between the first bit line (BLr) and the source line (SL). For example, the source line voltage and the first well voltage may range from 0V to 8V. The second word line voltage, and the second bit line voltage may be floating or range from 0V to 8V. The erase line voltage may range from 0V to 8V. The first bit line voltage may range from 0V to 8V, to induce voltage difference with the source line voltage. The first word line voltage may range from 0V to 8V, to activate read device D12. The second well voltage may be 0V.

The state of the non-volatile memory cell 100 is distinguished by the current flowing across the coupling device D11 and the read device D12. For example of the read operation, the read device D12 may be a PMOS device; therefore, the first word line voltage and the first bit line voltage may be 0V to activate the read device D12. Taking for example of the read operation, the source line voltage and the erase line voltage may be 1.8V. The channel of the coupling device D11 will be either conducting or remain off, based on the threshold voltage of the coupling device D11, which is controlled by charges stored in the floating gate 114. Moreover, during the read operation, the program device D13 may be inactive.

According to the program operation, erase operation, and read operation described above, the program path, the erase path and the read path may be separated to increase performance of the non-volatile memory cell 100.

Figure 8:
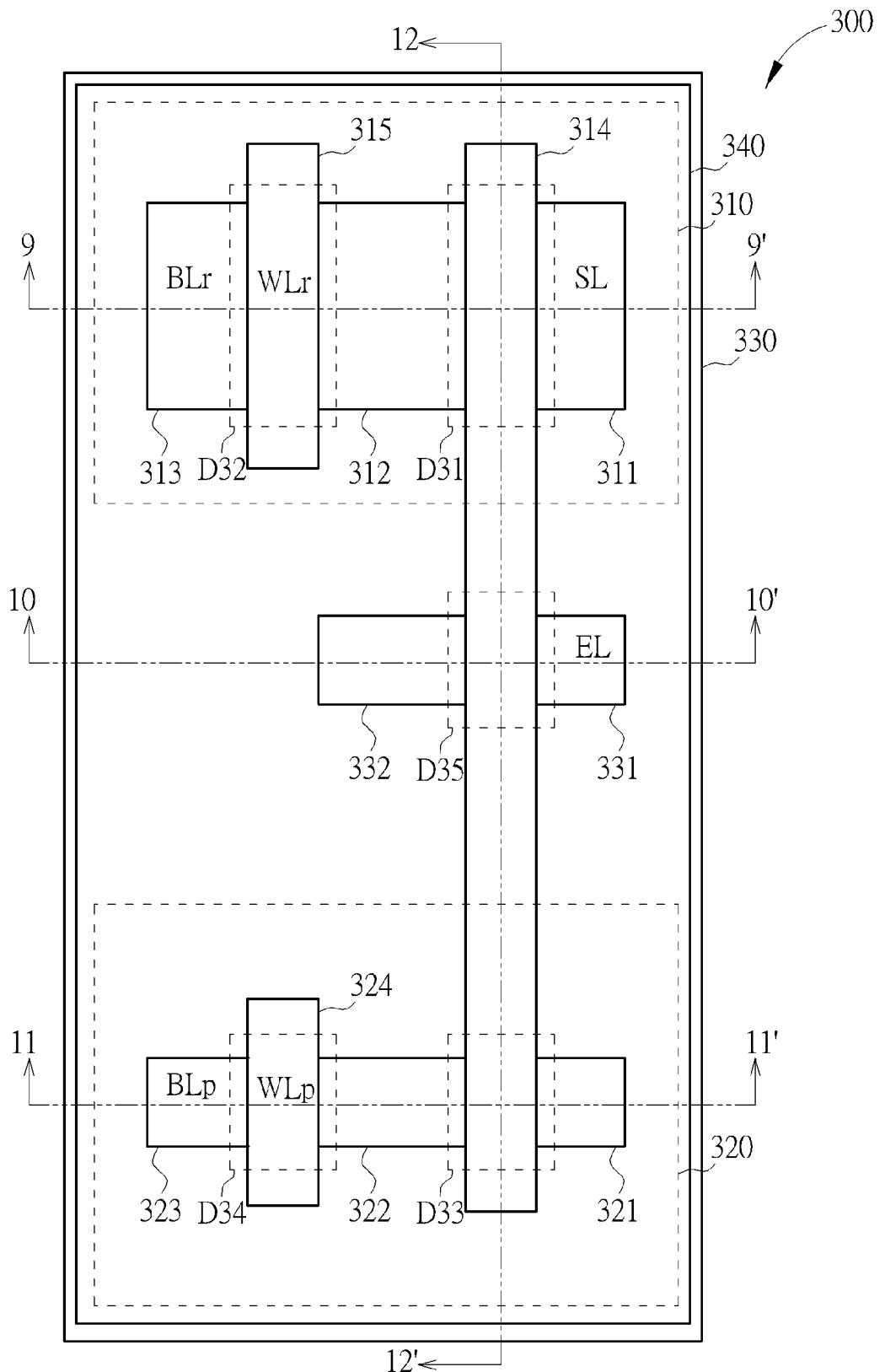
FIG. 8 illustrates a structure of a non-volatile memory cell according to a second embodiment of the present invention.

Please refer to FIG. 8. FIG. 8 illustrates a structure of a non-volatile memory cell 300 according to a second embodiment of the present invention. The non-volatile memory cell 300 may be formed on a substrate. The substrate may be p-type or n-type. The non-volatile memory cell 300 may comprise a coupling device D31, a read device D32, a floating gate device D33, a program device D34 and an erase device D35. The coupling device D31 and the read device D32 are formed on a first well 310. The floating gate device D33 and the program device D34 are formed on a second well 320. The erase device D35 is formed on a third well 330. The first well 310 and the second well 320 may be the second conductivity type, such as the p-well (PW). The third well may be the first conductivity type, such as the n-well (NW). The first well 310, the second well 320, and the third well 330 are formed on a fourth well 340. The fourth well may be a deep n-well (DNW). A first diffusion region 311, a second diffusion region 312 and a third diffusion region 313 are formed on the first well 310. A fourth diffusion region 321, a fifth diffusion region 322 and a sixth diffusion region 323 are formed on the second well 320. A seventh diffusion region 331 and an eighth diffusion region 332 are formed on the third well 330.

The coupling device D31 is formed by the first diffusion region 311, the second diffusion region 312 and a first part of a floating gate 314. The read device D32 is formed by the second diffusion region 312, the third diffusion region 313 and a gate 315. The floating gate device D33 is formed by the fourth diffusion region 321, the fifth diffusion region 322 and a second part of the floating gate 314. In another embodiment, the fourth diffusion region 321 of the floating gate device D33 may be omitted such that the floating gate device D33 is served as a capacitor device. The program device D34 is formed by the fifth diffusion region 322, the sixth diffusion region 323 and a gate 324. The erase device D35 is formed by the seventh diffusion region 331, the eighth diffusion region 332 and a third part of the floating gate 314. In another embodiment, the eighth diffusion region 332 of the erase device D35 may be omitted such that the erase device D35 is served as a capacitor device.

The source line (SL) is electrically coupled to the coupling device D31. The first bit line (BLr) is electrically coupled to the read device D32. The first word line (WLr) is electrically coupled to the gate 315 of the read device D32. The second bit line (BLp) is electrically coupled to the program device D34. The second word line (WLp) is electrically coupled to the gate 324 of the program device D34. And the erase line (EL) is electrically coupled to the erase device D35.

Figure 9:
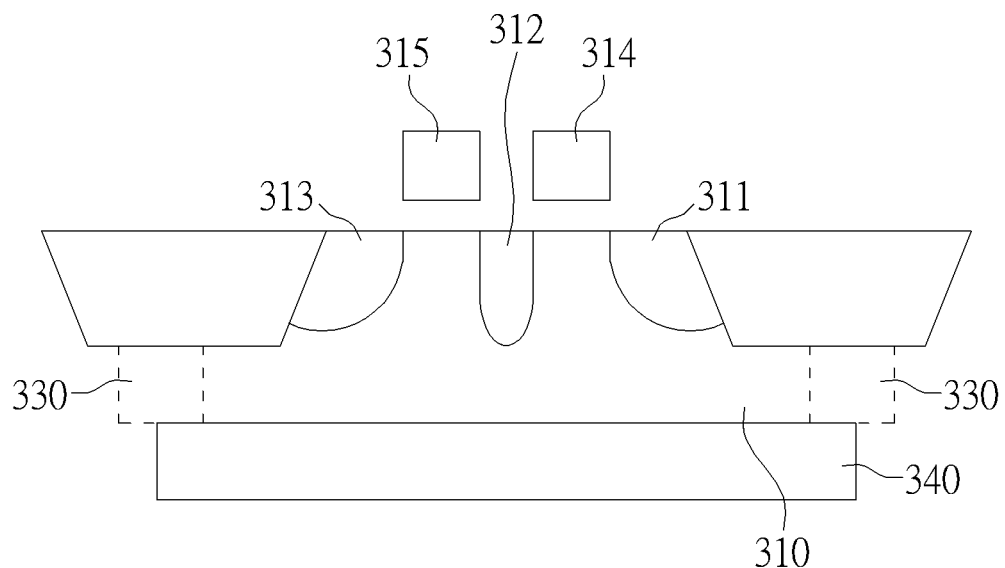
FIG. 9 illustrates a cross sectional view of the non-volatile memory cell in FIG. 8 along line 9-9'.
Figure 10:
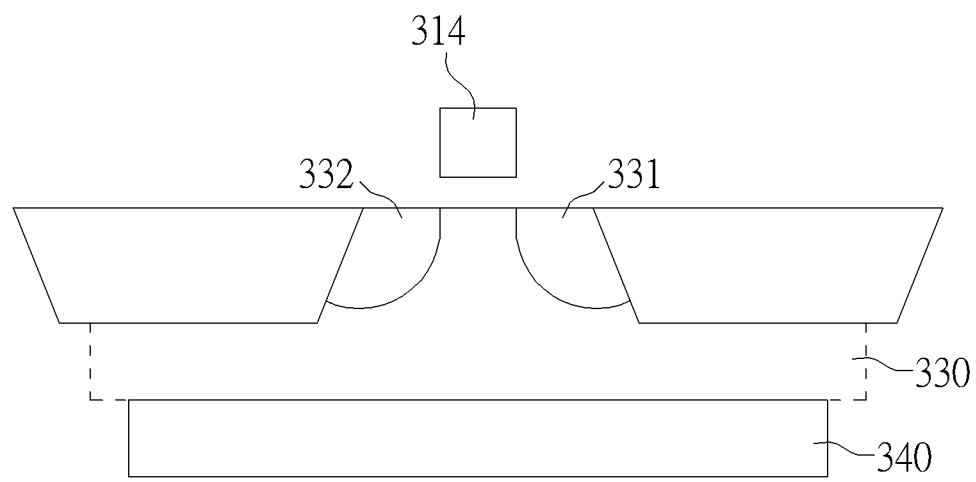
FIG. 10 illustrates a cross sectional view of the non-volatile memory cell in FIG. 8 along line 10-10'.
Figure 11:
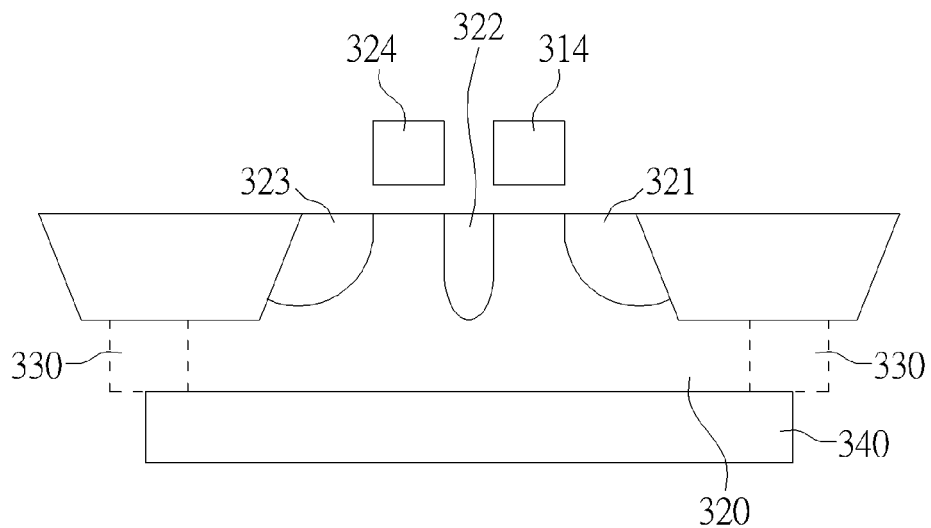
FIG. 11 illustrates a cross sectional view of the non-volatile memory cell in FIG. 8 along line 11-11'.
Figure 12:
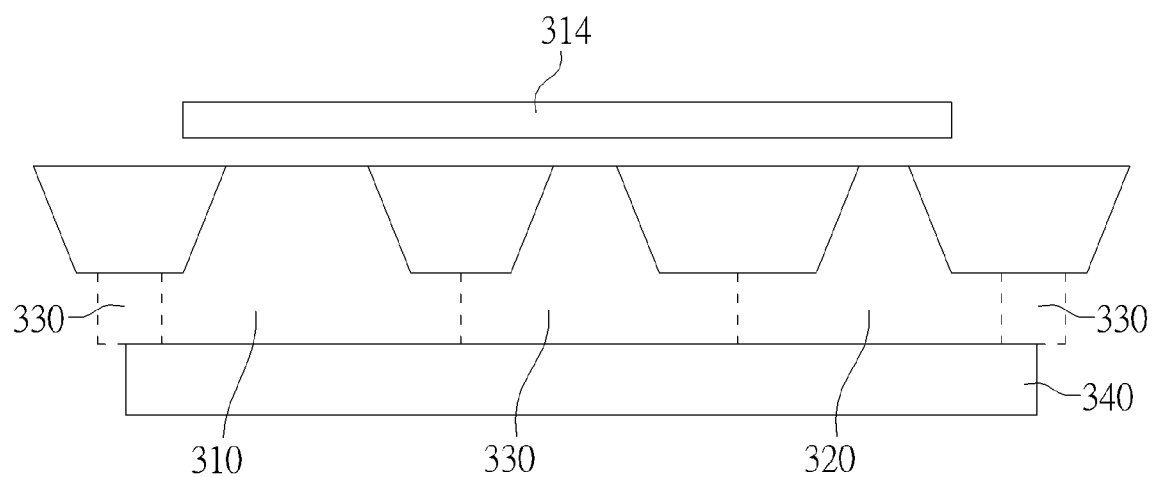
FIG. 12 illustrates a cross sectional view of the non-volatile memory cell in FIG. 8 along line 12-12'.

Please refer to FIG. 9 to FIG. 12. FIG. 9 to FIG. 12 illustrate cross sectional views of the non-volatile memory cell 300 in FIG. 8. FIG. 9 illustrates the cross sectional view of the non-volatile memory cell 300 in FIG. 8 along line 9-9'. The line 9-9' goes across the coupling device D31 and the read device D32 and the cross section of the coupling device D31 and the read device D32 formed on the first well 310 is illustrated. FIG. 10 illustrates the cross sectional view of the non-volatile memory cell 300 in FIG. 8 along line 10-10'. The line 10-10' goes across the erase device D35 and the cross section of the erase device D35 formed on the third well 330 is illustrated. FIG. 11 illustrates the cross sectional view of the non-volatile memory cell 300 in FIG. 8 along line 11-11'. The line 11-11' goes across the program device D34 and the floating gate device D33 and the cross section of the program device D34 and the floating gate device D33 formed on the second well 320 is illustrated. FIG. 12 illustrates the cross sectional view of the non-volatile memory cell 100 in FIG. 8 along line 12-12'. The line 12-12' goes across the floating gate 314 and the cross section of the floating gate 314 across the first well 310, the second well 320 and the third well 330 is illustrated.

Figure 13:
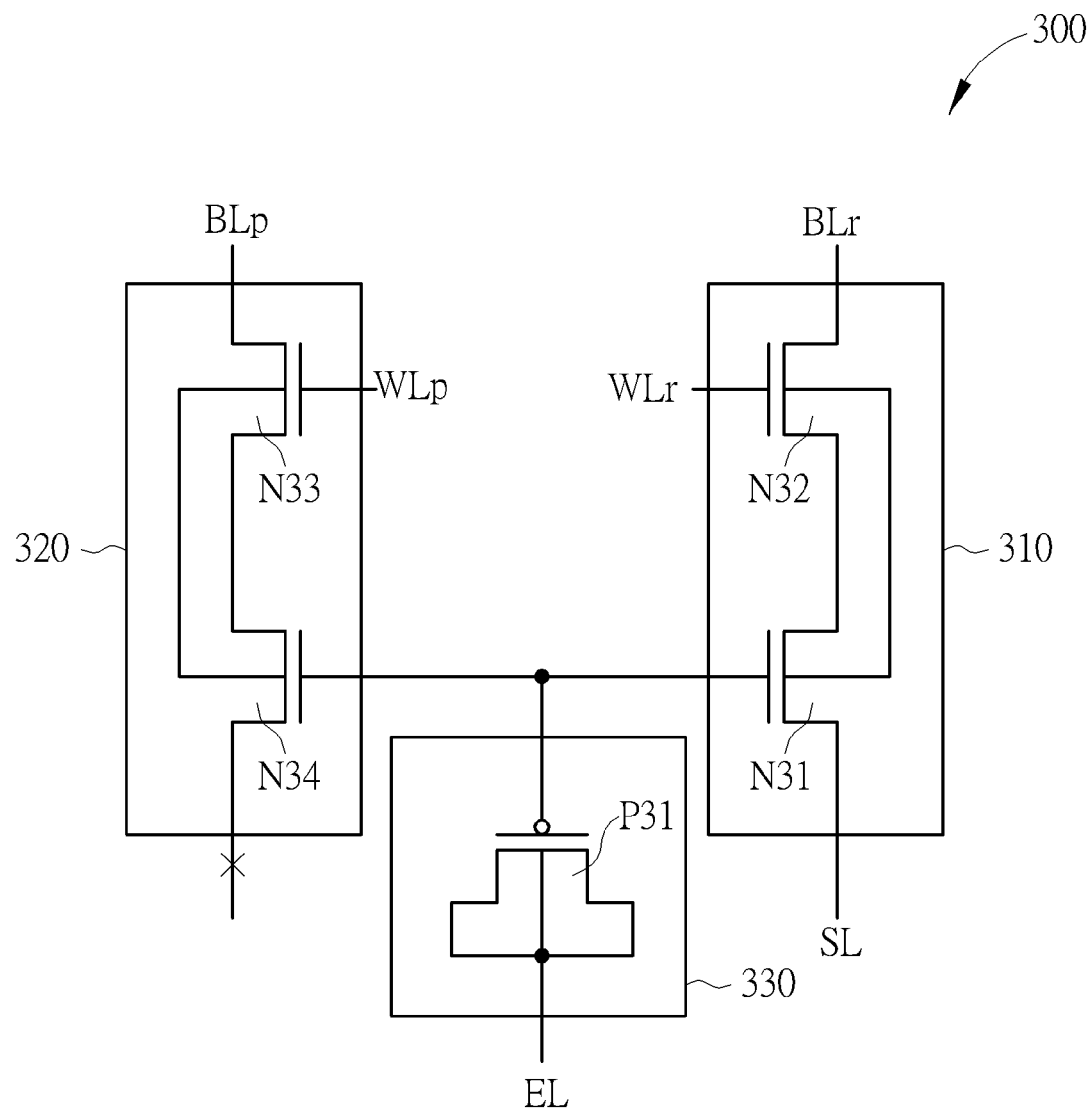
FIG. 13 illustrates a circuit diagram of the non-volatile memory cell in FIG. 8.

Please refer to FIG. 13. FIG. 13 illustrates a circuit diagram of the non-volatile memory cell 300 in FIG. 8. The non-volatile memory cell 300 may comprise the coupling device D31, the read device D32, the floating gate device D33, the program device D34 and the erase device D35. The coupling device D31 may be a first NMOS device N31 having a first terminal, a second terminal, a bulk terminal, and a gate terminal. In another embodiment, the bulk terminal of the first NMOS device N31 may be coupled to the second terminal of the first NMOS device N31. The read device D32 may be a second NMOS device N32 having a first terminal, a second terminal coupled to the first terminal of the first NMOS device N31, a gate terminal and a bulk terminal coupled to the bulk terminal of the first NMOS device N31. The program device D34 may be a third NMOS device N33 having a first terminal, a second terminal, a gate terminal and a bulk terminal. The floating gate device D33 may be a fourth NMOS device N34 (NMOS transistor or NMOS capacitor) having a first terminal coupled to the second terminal of the third NMOS device N33, and a gate terminal and a bulk terminal coupled to the bulk terminal of the third NMOS device N33. In another embodiment, the fourth NMOS device N34 may further comprise a second terminal. The erase device D35 may be a PMOS device P31 (PMOS transistor or PMOS capacitor) having a first terminal, a bulk terminal coupled to the first terminal of the PMOS device P31, and a gate terminal coupled to the gate terminal of the fourth NMOS device N34 and the gate terminal of the first NMOS device N31. In another embodiment, the PMOS device P31 may further comprise a second terminal.

The source line (SL) is coupled to the second terminal of the first NMOS device N31. The first bit line (BLr) is coupled to the first terminal of the second NMOS device N32. The first word line (WLr) is coupled to the gate terminal of the second NMOS device N32. The second bit line (BLp) is coupled to the first terminal of the third NMOS device N33. The second word line (WLp) is coupled to the gate terminal of the third NMOS device N33. And the erase line (EL) is coupled to the first terminal of the PMOS device P31. The second terminal of the fourth NMOS device N34 is floating. The bulk terminal of the first NMOS device N31 and the bulk terminal of the second NMOS device N32 are coupled to the first well 310. The bulk terminal of the fourth NMOS device N34 and the bulk terminal of the third NMOS device N33 are coupled to the second well 320.

For the non-volatile memory cell 300, a source line voltage is applied to the source line (SL). A first well voltage is applied to the first well 310. A first bit line voltage is applied to the first bit line (BLr). A first word line voltage is applied to the first word line (WLr). A second bit line voltage is applied to the second bit line (BLp). A second word line voltage is applied to the second word line (WLp). An erase line voltage is applied to the erase line (EL). A second well voltage is applied to the second well 320. A fourth well voltage may be applied to the fourth well 340.

During a program operation of the non-volatile memory cell 300, an electric field is meant to be built between the floating gate and the first terminal of the floating gate device D33, in order to perform Fowler-Nordheim tunneling across the gate dielectric layer of the floating gate device. Here is an example to implement the case. The source line voltage, the first well voltage, the erase line voltage, and the fourth well voltage may range from 0V to 25V. The second bit line voltage and the second well voltage may be 0V. The second word line voltage may range from 0V to 8V to turn on the program device D34. The first bit line voltage may be floating or range from 0V to 25V. The first word line voltage may be floating or range from 0V to 25V. In another embodiment, to enable the program operation, the bias conditions of the source line voltage and the first bit line voltage may be interchanged or be set at the same level. In an additional embodiment, to enable the same programming operation, one of the bit line or the source line (SL) may be electrically connected to the first well 310.

For example of the program operation, the second bit line voltage may be at 0V and the second word line voltage may be at 3.3V. The source line voltage, the first well voltage, and the erase line voltage may be at 10V. The program device D34 may be activated because of the voltage difference between the second word line WLp and the second bit line BLp. When the voltage coupled to the floating gate 314 is high enough, Fowler-Nordheim (FN) tunneling may be performed. Thus electrons may be injected into the second part of the floating gate 314. During the program operation, the read device D32 may be inactive because the first bit line BLr may be floating to deactivate the read path.

During a program inhibit operation of the non-volatile memory cell 300, an electric field may be prevented from building between the floating gate 314 and the first terminal of the floating gate device D33, in order to prevent Fowler-Nordheim tunneling to be performed across the gate dielectric layer of the floating gate device D33. For example, the source line voltage, the first well voltage, the erase line voltage, and the fourth well voltage may range from 0V to 25V. The second bit line voltage and the second word line voltage may range from 0V to 8V. The second well voltage may be 0V. The first bit line voltage may be floating or range from 0V to 25V. The first word line voltage may be floating or range from 0V to 25V. In another embodiment, to enable the program inhibit operation, the bias conditions of the source line voltage and the first bit line voltage may be interchanged or be set at the same level. In an additional embodiment, to enable the program inhibit operation, one of the bit lines or the source line (SL) may be electrically connected to the first well 310.

For example of the program inhibit operation, the second bit line voltage may be at 3.3V and the second word line voltage may be at 3.3V. The source line voltage, the first well voltage and the erase line voltage may be at 10V. The program device D34 may be deactivated because of the zero voltage difference between the second word line WLp and the second bit line BLp. The channel formation of the floating gate device D34 may be prevented and preventing the buildup of electric field for Fowler-Nordheim tunneling across the gate dielectric layer of the floating gate device D34 to ensure a successful program inhibit operation.

During an erase operation of the non-volatile memory cell 300, an electric field may be built between the floating gate and the first terminal of the erase device D35 to perform Fowler-Nordheim tunneling across the gate dielectric layer of the erase device D35. For example, the source line voltage, the first well voltage and the second well voltage may be 0V. The erase line voltage and the fourth well voltage may range from 0V to 25V. The first bit line voltage, the first word line voltage, the second bit line voltage, and the second word line voltage may be floating or 0V. In another embodiment, to enable the erase operation, the bias conditions of the source line voltage and the first bit-line voltage may be interchanged.

For example of the erase operation, the erase line voltage may be at 10V. The source line voltage, the first well voltage, and the second well voltage may be at 0V. The erase device D35 may have a high voltage across third part of the floating gate 314. Fowler-Nordheim (FN) tunneling may be performed. The electrons may be ejected from the third part of the floating gate 314 and into the third well 330.

During a read operation of the non-volatile memory cell 300, a current sensing path may be built between the first bit line (BLr) and the source line (SL). For example, the source line voltage, and the first well voltage may range from 0V to 8V. The second well voltage may be 0V. The second bit line voltage, and the second word line voltage may be floating or range from 0V to 8V. The erase line voltage and the fourth well voltage may range from 0V to 8V. The first bit line voltage may range from 0V to 8V, to induce voltage difference from the source line voltage. The first word line voltage may range from 0V to 8V to activate the read device D32.

The state of the non-volatile memory cell 300 is distinguished by the current flowing across the coupling device D31 and the read device D32. For example of the read operation, the read device D32 may be an NMOS device; the first word line voltage and the first bit line voltage may be 1.8V to activate the coupling device D31. Taking for example of the read operation, the source line voltage and the erase line voltage may be 0V. The channel of the read device D32 will be either conducting or remain off, based on the threshold voltage of the coupling device D31, which is controlled by charges stored in the floating gate 314. During the read operation, the program device D33 may be deactivated.

Note that the fourth well voltage may be supplied to the fourth well before implementing any of the operation of the non-volatile memory cell 300, in order to prevent forward-biased leakage current between the four wells 310, 320, 330, and 340.

According to the program operation, the erase operation, and the read operation described above, the program path, the erase path and the read path are separated from each other to improve the memory performance.

Figure 14:
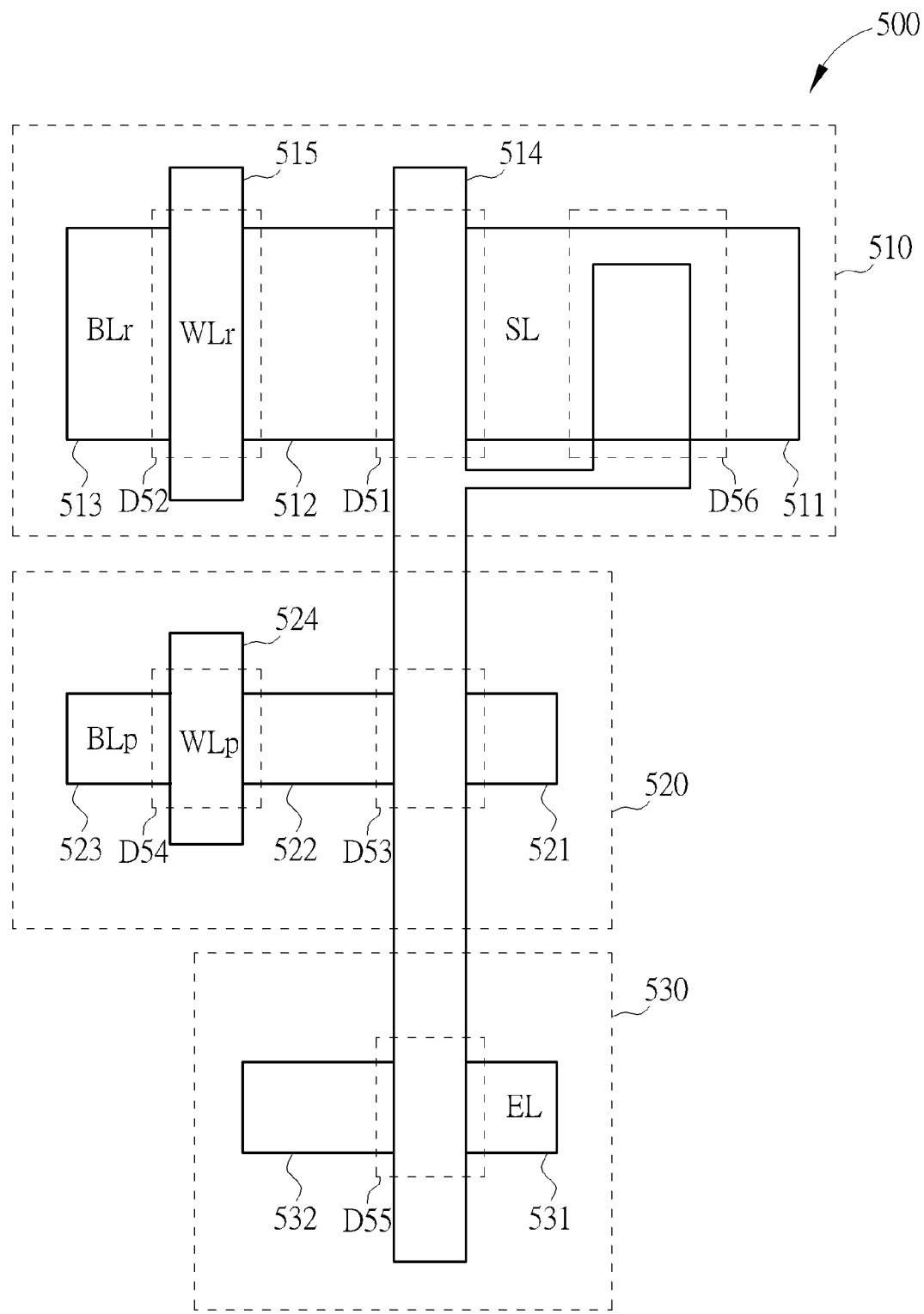
FIG. 14 illustrates a structure of a non-volatile memory cell according to a third embodiment of the present invention.

Please refer to FIG. 14. FIG. 14 illustrates a structure of a non-volatile memory cell 500 according to a third embodiment of the present invention. The non-volatile memory cell 500 may be formed on a substrate. The substrate may be p-type or n-type. The non-volatile memory cell 500 may comprise a coupling device D51, a read device D52, a floating gate device D53, a program device D54, an erase device D55 and an assistant device D56. The coupling device D51, the assistant device D56 and the read device D52 are formed on a first well 510. The floating gate device D53 and the program device D54 are formed on a second well 520. The erase device D55 is formed on a third well 530. The first well 510 and the third well 530 may be an n-well (NW). The second well 520 may be a p-well (PW). A first diffusion region 511, a second diffusion region 512 and a third diffusion region 513 are formed on the first well 510. A fourth diffusion region 521, a fifth diffusion region 522 and a sixth diffusion region 523 are formed on the second well 520. A seventh diffusion region 531 and an eighth diffusion region 532 are formed on the third well 530.

The coupling device D51 is formed by the first diffusion region 511, the second diffusion region 512, and a first part of a floating gate 514. The assistant device D56 is formed by the first diffusion region 511 and a fourth part of the floating gate 514. In some embodiments of the present invention, the assistant device D56 may be formed by a tenth diffusion region and the fourth part of the floating gate 514. The tenth diffusion region and the first diffusion region 511 may be electrically coupled through the use of contacts and metal layers of the fabrication technology used. The read device D52 is formed by the second diffusion region 512, the third diffusion region 513 and a gate 515. The floating gate device D53 is formed by the fourth diffusion region 521, the fifth diffusion region 522 and a second part of the floating gate 514. In another embodiment, the fourth diffusion region 521 of the floating gate device D53 may be omitted such that the floating gate 514 is served as a capacitor. The program device D54 is formed by the fifth diffusion region 522, the sixth diffusion region 523 and a gate 524. The erase device D55 is formed by the seventh diffusion region 531, the eighth diffusion region 532 and a third part of the floating gate 514. In another embodiment, the eighth diffusion region 532 of the erase device D55 may be omitted such that the erase device D55 is served as a capacitor device.

The source line (SL) is electrically coupled to the coupling device D51 and the assistant device D56. The first bit line (BLr) is electrically coupled to the read device D52. The first word line (WLr) is electrically coupled to the gate 515 of the read device D52. The second bit line (BLp) is electrically coupled to the program device D54. The second word line (WLp) is electrically coupled to the gate 524 of the program device D54. And the erase line (EL) is electrically coupled to the erase device D55.

Figure 15:
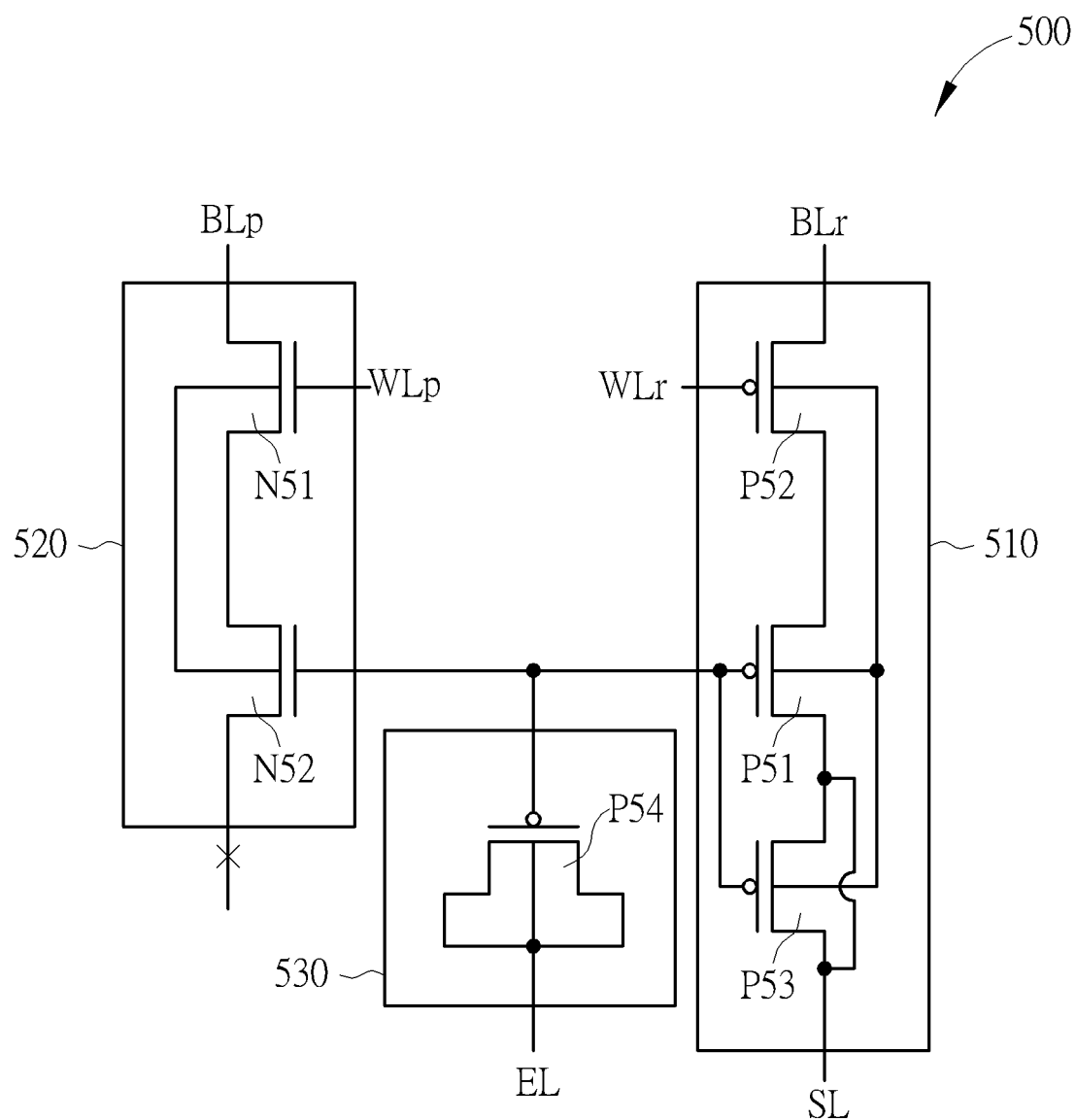
FIG. 15 illustrates a circuit diagram of the non-volatile memory cell in FIG. 14.

Please refer to FIG. 15. FIG. 15 illustrates a circuit diagram of the non-volatile memory cell 500 in FIG. 14. The non-volatile memory cell 500 may comprise the coupling device D51, the read device D52, the assistant device D56, the program device D54, the floating gate device D53 and the erase device D55. The coupling device D51 may be a first PMOS device P51 having a first terminal, a second terminal, a bulk terminal, and a gate terminal. The assistant device D56 may be a third PMOS device P53 (PMOS transistor or PMOS capacitor) having a first terminal coupled to the second terminal of the first PMOS device P51, a bulk terminal coupled to the bulk terminal of the first PMOS device P51, and a gate terminal coupled to the gate terminal of the first PMOS device P51. In another embodiment, the third PMOS device P53 may further comprise a second terminal. The second terminal of the third PMOS device P53 is coupled to the second terminal of the first PMOS device P51. The read device D52 may be a second PMOS device P52 having a first terminal, a second terminal coupled to the first terminal of the first PMOS device P51, a gate terminal and a bulk terminal coupled to the bulk terminal of the first PMOS device P51. The program device D54 may be a first NMOS device N51 having a first terminal, a second terminal, a gate terminal and a bulk terminal. The floating gate device D53 may be a second NMOS device N52 (NMOS transistor or NMOS capacitor) having a first terminal coupled to the second terminal of the first NMOS device N51, a gate terminal and a bulk terminal coupled to the bulk terminal of the first NMOS device N51. In another embodiment, the second NMOS device N52 may further comprise a second terminal. The erase device D55 may be a fourth PMOS device P54 (PMOS transistor or PMOS capacitor) having a first terminal, a bulk terminal coupled to the first terminal of the fourth PMOS device P54, and a gate terminal coupled to the gate terminal of the second NMOS device N52, the gate terminal of the first PMOS device P51 and the gate terminal of the third PMOS device P53. In another embodiment, the fourth PMOS device P54 may further comprise a second terminal.

The source line (SL) is coupled to the second terminal of the first PMOS device P51. The first bit line (BLr) is coupled to the first terminal of the second PMOS device P52. The first word line (WLr) is coupled to the gate terminal of the second PMOS device P52. The second bit line (BLp) is coupled to the first terminal of the first NMOS device N51. The second word line (WLp) is coupled to the gate terminal of the first NMOS device N51. And the erase line (EL) is coupled to the first terminal of the fourth PMOS device P54. The second terminal of the second NMOS device N52 is floating. The bulk terminal of the first PMOS device P51, the bulk terminal of the second PMOS device P52, and the bulk of the third PMOS device P53 may be coupled to the first well 510. The bulk terminal of the second NMOS device N52 and the bulk terminal of the first NMOS device N51 are coupled to the second well 520.

For the non-volatile memory cell 500, a source line voltage is applied to the source line (SL) and a first well voltage is applied to the first well 510. A first bit line voltage is applied to the first bit line (BLr). A first word line voltage is applied to the first word line (WLr). A second bit line voltage is applied to the second bit line (BLp). A second word line voltage is applied to the second word line (WLp). An erase line voltage is applied to the erase line (EL). A second well voltage is applied to the second well 520. A fourth well voltage may be applied to the fourth well 540.

The non-volatile memory cell 500 is formed by the non-volatile memory cell 100 with an additional assistant device D56. The operation of the non-volatile memory cell 500 may be the same as the non-volatile memory cell 100 since the assistant device D56 may be a parasitic capacitive device. For the non-volatile memory cell 500, the values of the source line voltage, the first word line voltage, the erase line voltage, the first bit line voltage, the second bit line voltage, the first well voltage, the second well voltage, the second word line voltage and the fourth well voltage may have the same values as that applied in the non-volatile memory cell 100 for the program operation, the program inhibit operation, the erase operation and the read operation.

Figure 16:
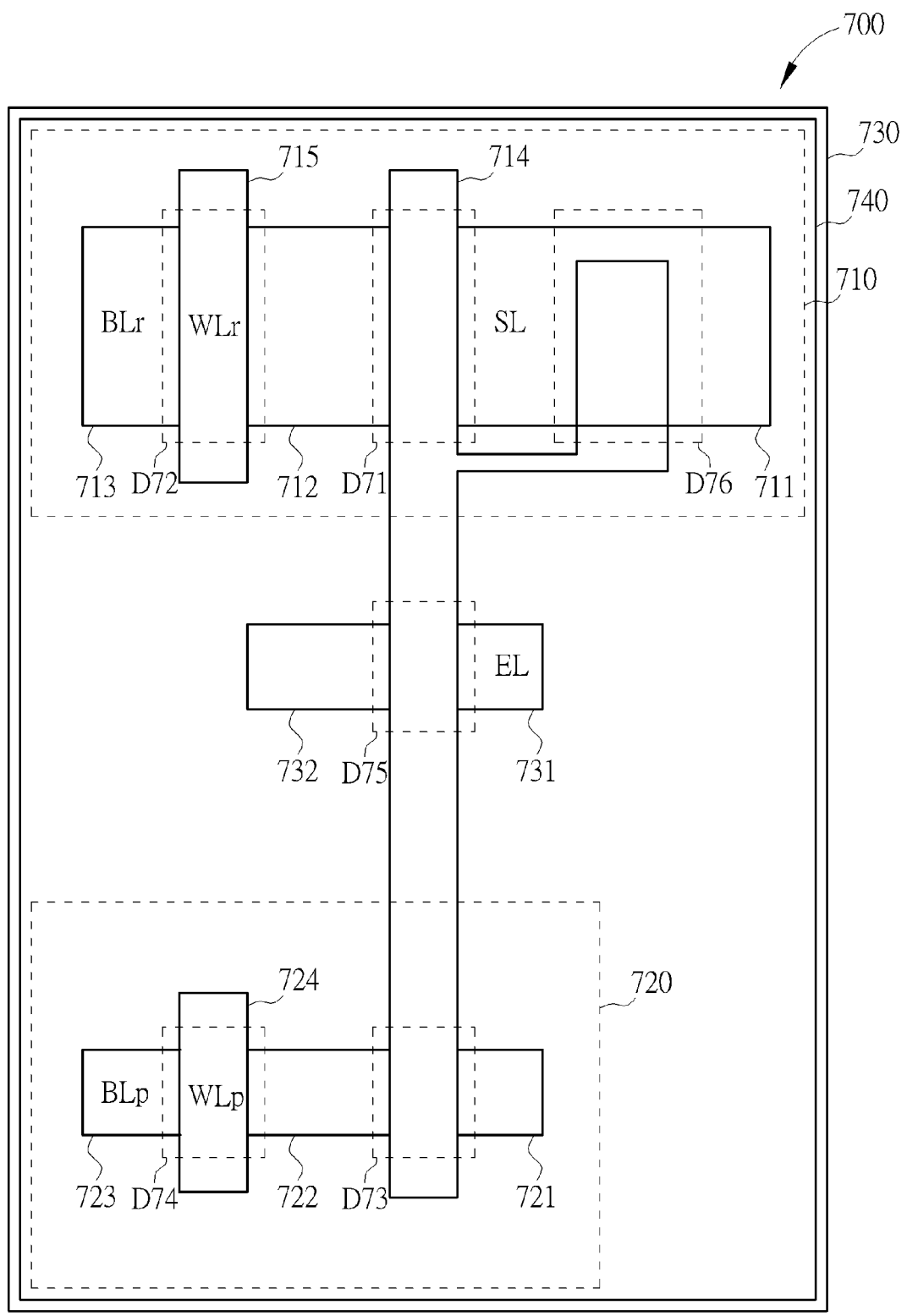
FIG. 16 illustrates a structure of a non-volatile memory cell according to a fourth embodiment of the present invention.

Please refer to FIG. 16. FIG. 16 illustrates a structure of a non-volatile memory cell 700 according to a fourth embodiment of the present invention. The non-volatile memory cell 700 may be formed on a substrate. The substrate may be p-type or n-type. The non-volatile memory cell 700 may comprise a coupling device D71, a read device D72, a floating gate device D73, a program device D74, an erase device D75, and an assistant device D76. The coupling device D71, the assistant device D76 and the read device D72 are formed on a first well 710. The floating gate device D73 and the program device D74 are formed on a second well 720. The erase device D75 is formed on a third well 730. The first well 710 and the second well 720 may be p-wells (PW). The third well may be an n-well (NW). The first well 710, the second well 720, and the third well 730 are formed on a fourth well 740. The fourth well 740 may be a deep n-well (DNW). A first diffusion region 711, a second diffusion region 712 and a third diffusion region 713 are formed on the first well 710. A fourth diffusion region 721, a fifth diffusion region 722 and a sixth diffusion region 723 are formed on the second well 720. A seventh diffusion region 731 and an eighth diffusion region 732 are formed on the third well 730.

The coupling device D71 is formed by the first diffusion region 711, the second diffusion region 712 and a first part of a floating gate 714. The assistant device D76 is formed by the first diffusion region 711 and a fourth part of the floating gate 714. In some embodiments of the present invention, the assistant device D76 may be formed by a tenth diffusion region and the fourth part of the floating gate 714. The tenth diffusion region and the first diffusion region 711 may be electrically coupled through the use of contacts and metal layers of the fabrication technology used. The read device D72 is formed by the second diffusion region 712, the third diffusion region 713 and a gate 715. The floating gate device D73 is formed by the fourth diffusion region 721, the fifth diffusion region 722 and a second part of the floating gate 714. In another embodiment, the fourth diffusion region 721 of the floating gate device D73 may be omitted such that the floating gate device D73 is served as a capacitor device. The program device D74 is formed by the fifth diffusion region 722, the sixth diffusion region 723 and a gate 724. The erase device D75 is formed by the seventh diffusion region 731, the eighth diffusion region 732 and a third part of the floating gate 714. In another embodiment, the eighth diffusion region 732 of the erase device D75 may be omitted such that the erase device D75 is served as a capacitor device.

The source line (SL) is electrically coupled to the coupling device D71 and the assistant device D76. The first bit line (BLr) is electrically coupled to the read device D72. The first word line (WLr) is electrically coupled to the gate 715 of the read device D72. The second bit line (BLp) is electrically coupled to the program device D74. The second word line (WLp) is electrically coupled to the gate 724 of the program device D74. And the erase line (EL) is electrically coupled to the erase device D75.

Figure 17:
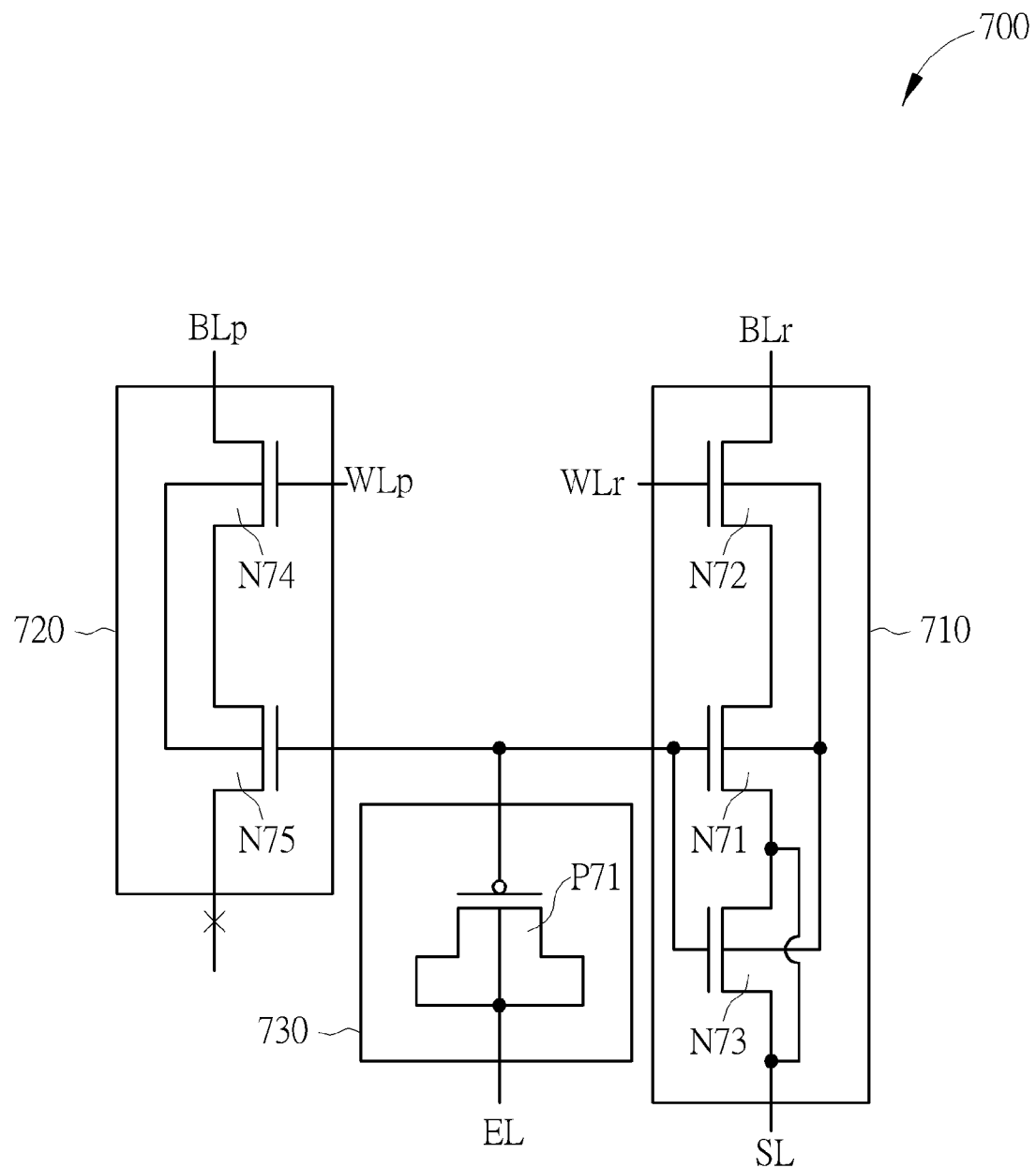
FIG. 17 illustrates a circuit diagram of the non-volatile memory cell in FIG. 16.

Please refer to FIG. 17. FIG. 17 illustrates a circuit diagram of the non-volatile memory cell 700 in FIG. 16. The non-volatile memory cell 700 may comprise the coupling device D71, the assistant device D76, the read device D72, the program device D74, the floating gate device D73 and the erase device D75. The coupling device D71 may be a first NMOS device N71 having a first terminal, a second terminal, a bulk terminal, and a gate terminal. The read device D72 may be a second NMOS device N72 having a first terminal, a second terminal coupled to the first terminal of the first NMOS device N71, a gate terminal and a bulk terminal coupled to the bulk terminal of the first NMOS device N71. The assistant device D76 may be a third NMOS device N73 (NMOS transistor or NMOS capacitor) having a first terminal, a bulk terminal coupled to the bulk terminal of the first NMOS device N71, a gate terminal coupled to the gate terminal of the first NMOS device N71. In another embodiment, the third NMOS device N73 may further comprise a second terminal. The first terminal and the second terminal of the third NMOS device N73 are coupled to the second terminal of the first NMOS device N71. The program device D74 may be a fourth NMOS device N74 having a first terminal, a second terminal, a gate terminal and a bulk terminal. The floating gate device D73 may be a fifth NMOS device N75 (NMOS transistor or NMOS capacitor) having a first terminal coupled to the second terminal of the fourth NMOS device N74, a gate terminal, and a bulk terminal coupled to the bulk terminal of the fourth NMOS device N74. In another embodiment, the fifth NMOS device N75 may further comprise a second terminal. The erase device D75 may be a PMOS device P71 (PMOS transistor or PMOS capacitor) device having a first terminal, a bulk terminal coupled to the first terminal of the PMOS device P71, and a gate terminal coupled to the gate terminal of the fifth NMOS device N75, the gate terminal of the first NMOS device N71, and the gate of the third NMOS device N73. In another embodiment, the PMOS device P71 may further comprise a second terminal.

The source line (SL) is coupled to the second terminal of the first NMOS device N71. The first bit line (BLr) is coupled to the first terminal of the second NMOS device N72. The first word line (WLr) is coupled to the gate terminal of the second NMOS device N72. The second bit line (BLp) is coupled to the first terminal of the fourth NMOS device N74. The second word line (WLp) is coupled to the gate terminal of the fourth NMOS device N74. And the erase line (EL) is coupled to the first terminal of the PMOS device P71. The second terminal of the fifth NMOS device N75 is floating. The bulk terminal of the first NMOS device N71, the bulk terminal of the second NMOS device N72, and the bulk of the third NMOS device N73 may be coupled to the first well 710. The bulk terminal of the fifth NMOS device N75 and the bulk terminal of the fourth NMOS device N74 are coupled to the second well 720.

For the non-volatile memory cell 700, a source line voltage is applied to the source line (SL) and a first well voltage is applied to the first well 710. A first bit line voltage is applied to the first bit line (BLr). A first word line voltage is applied to the first word line (WLr). A second bit line voltage is applied to the second bit line (BLp). A second word line voltage is applied to the second word line (WLp). An erase line voltage is applied to the erase line (EL). A second well voltage is applied to the second well 720. A fourth well voltage may be applied to the fourth well 740.

The non-volatile memory cell 700 is formed by the non-volatile memory cell 300 with an additional assistant device D76. The operation of the non-volatile memory cell 700 may be the same as the non-volatile memory cell 300 since the assistant device D76 may be treated as a parasitic capacitive device. For the non-volatile memory cell 700, the values of the source line voltage, the first word line voltage, the erase line voltage, the first bit line voltage, the second bit line voltage, the first well voltage, the second well voltage, the second word line voltage and the fourth well voltage may have the same values as that applied in the non-volatile memory cell 300 for the program operation, the program inhibit operation, the erase operation and the read operation.

Figure 18:
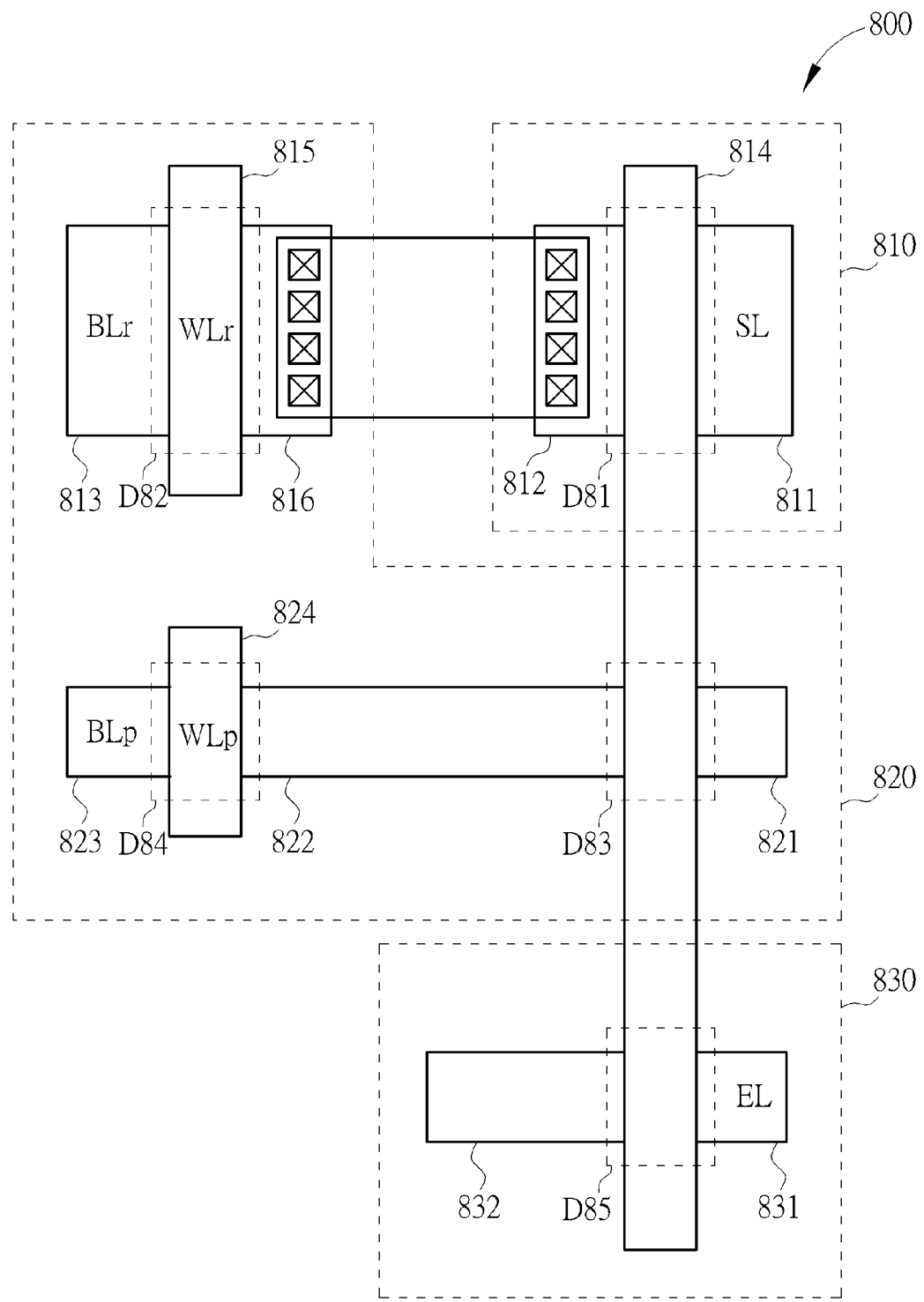
FIG. 18 illustrates the non-volatile memory cell according to a fifth embodiment of the present invention.

Please refer to FIG. 18. FIG. 18 illustrates the non-volatile memory cell 800 according to a fifth embodiment of the present invention. The non-volatile memory cell 800 may be formed on a substrate. The substrate may be p-type or n-type. The non-volatile memory cell 800 may comprise a coupling device D81, a read device D82, a floating gate device D83, a program device D84 and an erase device D85. The coupling device D81 is formed on a first well 810. The floating gate device D83, the program device D84 and the read device D82 are formed on a second well 820. The erase device D85 is formed on a third well 830. The first well 810 and the third well 830 may be an n-well (NW). The second well 120 may be a p-well (PW). A first diffusion region 811, and a second diffusion region 812 are formed on the first well 810. A third diffusion region 813, a ninth diffusion region 816, a fourth diffusion region 821, a fifth diffusion region 822 and a sixth diffusion region 823 are formed on the second well 820. A seventh diffusion region 831 and an eighth diffusion region 832 are formed on the third well 830.

The coupling device D81 is formed by the first diffusion region 811, the second diffusion region 812 and a first part of a floating gate 814. The read device D82 is formed by the ninth diffusion region 816, the third diffusion region 813 and a gate 815. The read device D82 may be electrically coupled to the coupling device D81. The ninth diffusion region 816 and the second diffusion region 812 may be electrically coupled using contacts and metal layers of the fabrication technology. The floating gate device D83 is formed by the fourth diffusion region 821, the fifth diffusion region 822 and a second part of the floating gate 814. In some embodiment, the fourth diffusion region 821 of the floating gate device D83 is omitted such that the floating gate device D83 is served as a capacitor device. The program device D84 is formed by the fifth diffusion region 822, the sixth diffusion region 823 and a gate 824. The erase device D85 is formed by the seventh diffusion region 831, and a third part of the floating gate 814. In some embodiment, the erase device D84 may further comprise the eighth diffusion region 832.

A source line (SL) is electrically coupled to the coupling device D81. A first bit line (BLr) is electrically coupled to the read device D82. A first word line (WLr) is electrically coupled to the gate 815 of the read device D82. A second bit line (BLp) is electrically coupled to the program device D84. A second word line (WLp) is electrically coupled to the gate 824 of the program device D84. And an erase line (EL) is electrically coupled to the erase device D85.

As shown in FIG. 18, the read device D82 may be formed on the second well 820. The read device D82 may be electrically coupled to the coupling device D81 but formed on separate wells. Note that the non-volatile memory cell in the second embodiment, third embodiment and fourth embodiment of the present invention may also have the read device of the respective embodiments formed on the second well of the respective embodiments.

Figure 19:
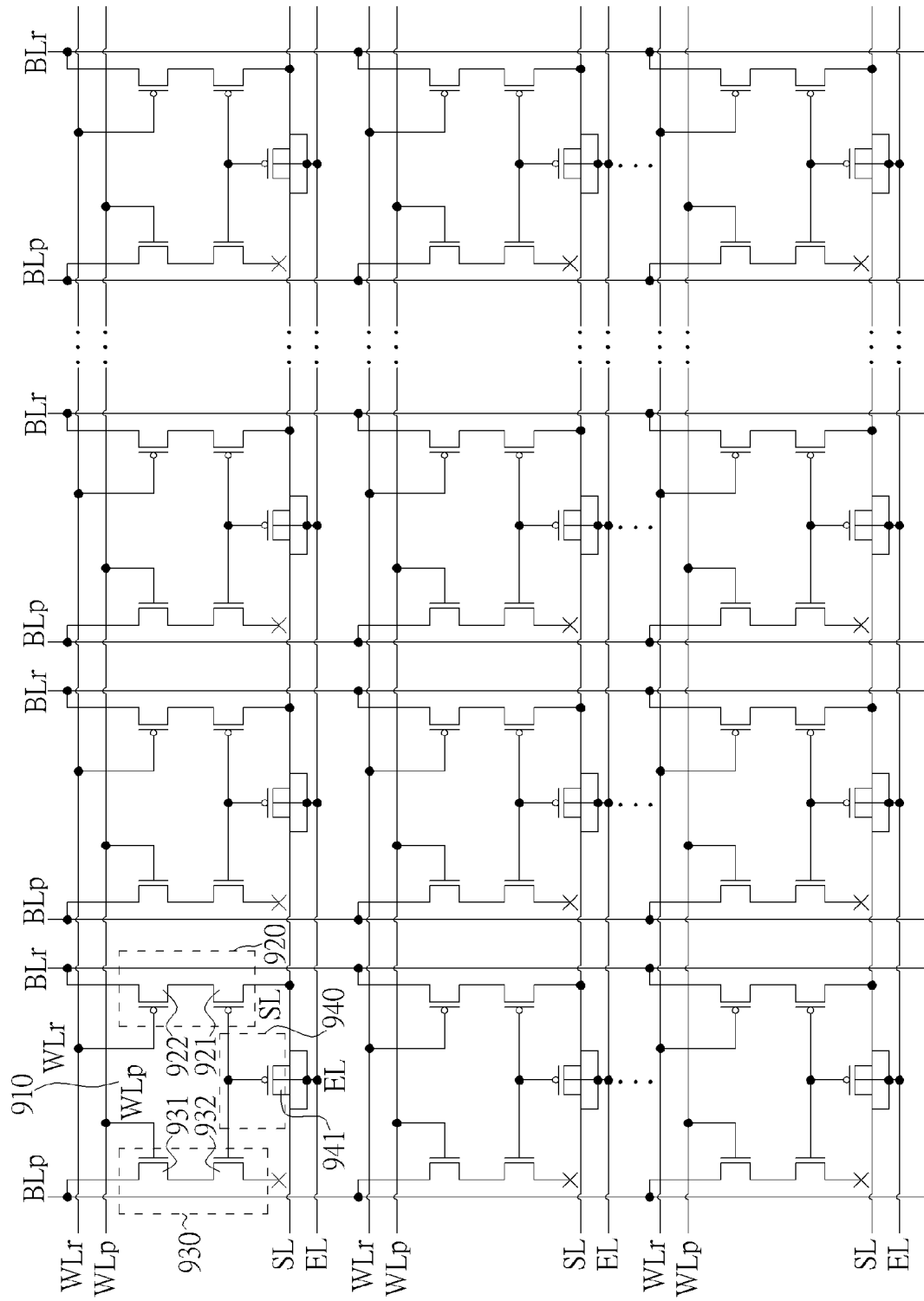
FIG. 19 illustrates a non-volatile memory having a plurality of non-volatile memory cells according to an embodiment of the present invention.

Please refer to FIG. 19. FIG. 19 illustrates a non-volatile memory 900 having a plurality of non-volatile memory cells 910 according to an embodiment of the present invention. Each of the plurality of non-volatile memory cells may comprise a first well 920, a second well 930, a third well 940, a coupling device 921 formed on the first well 920, a read device 922 formed on the first well 920, a program device 931 formed on the second well 930, a floating gate device 932 formed on the second well 930, and an erase device 941 formed on the third well 940. In some embodiments of the present invention, the coupling device 921 may be coupled to an assistant device to compensate for a gate area requirement between devices such as the coupling device 921, the erase device 941, and the floating gate device 932. The non-volatile memory 900 may comprise N×M array of a non-volatile memory cell 910, N being a number of rows of the non-volatile memory cell 910 and M being a number of columns of the non-volatile memory cell 910. Each of the non-volatile memory cells 910 in a row is coupled to a source line (SL) through the coupling device 921, an erase line (EL) through the erase device 941, a first word line (WLr) through the read device 922, and a second word line (WLp) through the program device 931. Each of the non-volatile memory cells 910 in a column is coupled to a first bit line (BLr) through the read device 922 and a second bit line (BLp) through the program device 931.

The first word line (WLr) or the second word line (WLp) may be used to specify the row of non-volatile memory cells 910. And the first bit line (BLr) or the second bit line (BLp) may be used to specify the column of non-volatile memory cells 910. Selections of the row and the column are used to identify a non-volatile memory cell 910 used for performing a read operation or a program operation. The entire row of non-volatile memory cells 910 may be referred to as a page.

An erase operation may be performed on a page by applying an erase line voltage that may be 10V on an erase line (EL). The remaining voltage sources may be at 0V. Performing the erase operation on a page may be referred to as a page erase operation.

Performing the read operation, the program operation and the program inhibit operation on a page is also possible since the plurality of non-volatile memory cells 910 of each page share a common source line (SL). The read operation, the program operation and the program inhibit operation of a page may be performed when a source line voltage greater than 0V is supplied to the source line (SL).

For the program operation of a selected page, the source line (SL) and the first well 920 of the page may be supplied with a source line voltage of 10V. The erase line voltage and the first word line voltage may be at 10V. The first bit line voltage may be floating. The second word line voltage may be at 3.3V and the second bit line voltage may be at 0V.

For the program inhibit operation of the selected page, the source line (SL) and the first well 920 of the page may be supplied with a source line voltage of 10V. The erase line voltage and the first word line voltage may be at 10V. The first bit line voltage may be floating. The second word line voltage and the second bit line voltage may be at 3.3V.

During the program/program inhibit operation, all the first bit lines (BLr) of the unselected pages may be floating, the second bit line (BLp) may be at 0V or 3.3V, and the remaining voltage sources may be at 0V.

For the read operation of a selected page, the source line (SL) of the page may be supplied with a source line voltage of 1.8V. The erase line voltage may be at 1.8V. The selected non-volatile memory cell may have the first bit line of the selected non-volatile memory cell supplied with a first bit line voltage of 0V. Unselected non-volatile memory cells may have their first bit lines floating.

Note that the program operation and the erase operation of the array may be executed in a page program mode or in a page erase mode since the plurality of non-volatile memory cells 910 of each page share a common source line (SL), a common first well and a common erase line (EL).

For the present invention, a non-volatile memory cell may apply a source line (SL) and an erase line (EL) with a program voltage or an erase voltage. During such corresponding operations, in order to define the floating gate voltage well, the area ratio of a coupling device to the entire floating gate capacitance is preferred to be over 50%, which leads to a large area of the device itself. But in some cases, the coupling device (as a part of the read path) would be preferred smaller for design flexibility, and induces a trade-off issue between the area and the aspect ratio of the coupling device, which could be easily solved by the addition of the assistant device. By means of that addition, it helps the cell to increase or stabilize the ratio of the coupling device to the floating gate device and/or the erase device. Note that the given values are only examples to illustrate aspects of the present invention for clarity and are not intended to limit the scope of the present invention.

During a program operation, Fowler-Nordheim (FN) tunneling may occur at a floating gate device. Since the floating gate device is serially connected to a program device through a diffusion region, a second bit line (BLp) coupled to the program device may be grounded to allow the FN tunneling to occur. Electrons may be injected into the floating gate.

During an erase operation, FN tunneling may occur at an erase device when an erase line voltage is applied at an erase line (EL). The electrons that were injected into the floating gate during the programming operation are ejected from the floating gate during the erase operation. To perform a program inhibit on the non-volatile memory cell, a high voltage value is fed into the second bit line (BLp) to inhibit the FN tunneling.

During a read operation, a current flowing through a read device and a coupling device is a read current. The read current is used to indicate the logic state of the non-volatile memory cell. A high value for the read current may indicate logic high. And a low value for the read current may indicate logic low. In some embodiments of the present invention, a high value for the read current may indicate logic low. And a low value for the read current may indicate logic high.

The present invention has separated a read device, a program device and an erase device of a non-volatile memory cell from each other. A bit line for the read device may be electrically coupled to a sense amplifier and a bit line for the program device may be electrically coupled to a data page buffer. Thus a read operation would be separate from that of a program operation and/or an erase operation. With the separation of different operations, the number of cycles that the non-volatile memory cell may endure during multiple time programming is significantly increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-volatile memory cell comprising:
    a coupling device formed on a first well, a second terminal of the coupling device is electrically coupled to a source line;
    a read device electrically directly connected to the coupling device, a first terminal of the read device is electrically coupled to a first bit line, a gate of the read device is electrically coupled to a first word line;
    a floating gate device formed on a second well;
    a program device electrically connected to the floating gate device and formed on the second well, a first terminal of the program device is electrically coupled to a second bit line, a gate of the program device is electrically coupled to a second word line; and
    an erase device formed on a third well, a first terminal of the erase device is electrically coupled to an erase line;
    wherein the coupling device, the floating gate device and the erase device are coupled by a common floating gate.

2. The non-volatile memory cell of claim 1, wherein the read device is formed on the first well.

3. The non-volatile memory cell of claim 1, wherein the read device is formed on the second well.

4. The non-volatile memory cell of claim 1, wherein a gate of the coupling device is a first part of the common floating gate formed on the first well, a gate of the read device is formed on the first well, and a second terminal of the read device is electrically coupled to a first terminal of the coupling device.

5. The non-volatile memory cell of claim 1, further comprising an assistant device coupled to the coupling device, the floating gate device, and the erase device.

6. The non-volatile memory cell of claim 5, wherein a second terminal of the coupling device is electrically coupled to the assistant device.

7. The non-volatile memory cell of claim 1, wherein a gate of the floating gate device is a second part of the common floating gate formed on the second well, a gate of the program device is formed on the second well, and a second terminal of the program device is electrically coupled to a first terminal of the floating gate device.

8. The non-volatile memory cell of claim 1, wherein a gate of the erase device is a third part of the common floating gate formed on the third well.

9. The non-volatile memory cell of claim 1, wherein the first well and the third well are N-wells formed on a substrate and the second well is a P-well formed on the substrate.

10. The non-volatile memory cell of claim 1, wherein the third well is an N-well formed on a deep N-well formed on a substrate, and the first well and the second well are P-wells formed on the deep N-well.

11. The non-volatile memory cell of claim 1, wherein an area of a gate of the coupling device is larger than an area of a gate of the floating gate device.

12. A memory system having a plurality of the non-volatile memory cells of claim 1, the memory system comprising:
    a plurality of the first bit lines each coupled to the first terminals of the read devices of the non-volatile memory cells in a corresponding column;
    a plurality of the second bit lines each coupled to the first terminals of the program devices of the non-volatile memory cells in a corresponding column;
    a plurality of the first word lines each coupled to the gates of the read devices of the non-volatile memory cells in a corresponding row;
    a plurality of the second word lines each coupled to the gates of the program devices of the non-volatile memory cells in a corresponding row;
    a plurality of the source lines each coupled to the second terminals of the coupling devices of the non-volatile memory cells in a corresponding row; and
    a plurality of the erase lines each coupled to the first terminals of the erase devices of the non-volatile memory cells in a corresponding row.

13. A non-volatile memory cell comprising:
    a coupling device formed on a first well;
    a read device formed on a second well and electrically directly connected to the coupling device;
    a floating gate device formed on the second well;
    a program device electrically connected to the floating gate device and formed on the second well; and
    an erase device formed on a third well;
    wherein the coupling device, the floating gate device and the erase device are coupled by a common floating gate.

* * * * *